United States Patent
Balakrishnan et al.

(10) Patent No.: US 9,466,690 B1
(45) Date of Patent: Oct. 11, 2016

(54) PRECISELY CONTROLLING III-V HEIGHT

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/994,738

(22) Filed: Jan. 13, 2016

(51) Int. Cl.
| | |
|---|---|
| H01L 21/76 | (2006.01) |
| H01L 29/66 | (2006.01) |
| H01L 29/78 | (2006.01) |
| H01L 21/768 | (2006.01) |
| H01L 21/306 | (2006.01) |
| H01L 21/311 | (2006.01) |

(52) U.S. Cl.
CPC ... *H01L 29/66522* (2013.01); *H01L 21/30612* (2013.01); *H01L 21/31116* (2013.01); *H01L 21/76802* (2013.01); *H01L 29/6653* (2013.01); *H01L 29/6656* (2013.01); *H01L 29/66795* (2013.01); *H01L 29/7851* (2013.01)

(58) Field of Classification Search
CPC ............ H01L 29/66522; H01L 21/31116; H01L 29/6656; H01L 21/30612; H01L 29/7851; H01L 29/66795; H01L 29/6653; H01L 21/76802
See application file for complete search history.

(56) References Cited

U.S. PATENT DOCUMENTS

| | | | |
|---|---|---|---|
| 8,354,320 B1 | 1/2013 | Xie et al. | |
| 8,659,097 B2 | 2/2014 | Mor et al. | |
| 8,728,881 B2 | 5/2014 | Zhu et al. | |
| 8,841,188 B2 * | 9/2014 | Reznicek et al. | H01L 21/82382 257/401 |
| 8,975,698 B2 | 3/2015 | Mor et al. | |
| 9,041,158 B2 | 5/2015 | Wann et al. | |
| 9,070,771 B2 | 6/2015 | Reznicek et al. | |
| 2011/0049568 A1 | 3/2011 | Lochtefeld et al. | |
| 2014/0306317 A1 | 10/2014 | Licausi | |
| 2015/0115418 A1 | 4/2015 | Wei et al. | |
| 2015/0162404 A1 | 6/2015 | Yang et al. | |

FOREIGN PATENT DOCUMENTS

EP 2629320 A2 8/2013

* cited by examiner

*Primary Examiner* — Roy Potter
*Assistant Examiner* — Paul Patton
(74) *Attorney, Agent, or Firm* — Scully, Scott, Murphy & Presser, P.C.; Louis J. Percello, Esq.

(57) ABSTRACT

After forming trenches extending through a dielectric material stack including, from bottom to top, a first dielectric layer, a second dielectric layer and a third dielectric layer that is located over a semiconductor substrate, a fin stack of, from bottom to top, an insulating III-V compound material fin portion and a III-V compound semiconductor fin is formed within each trench. The third dielectric layer is removed to expose a first portion of each III-V compound semiconductor fin. After forming a sidewall spacer on sidewalls of the first portion of each III-V compound semiconductor fin, the second dielectric layer is removed to expose a second portion of each III-V compound semiconductor fin. The exposed second portion of each III-V compound semiconductor fin is removed. The remaining first portion of each III-V compound semiconductor fin constitutes an active portion over which a FinFET is subsequently formed.

20 Claims, 17 Drawing Sheets

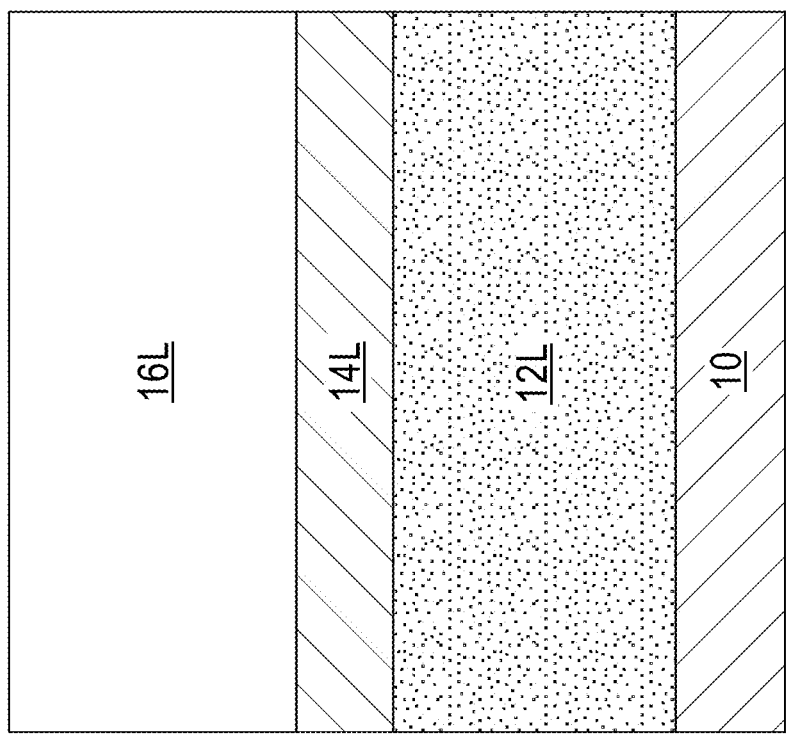
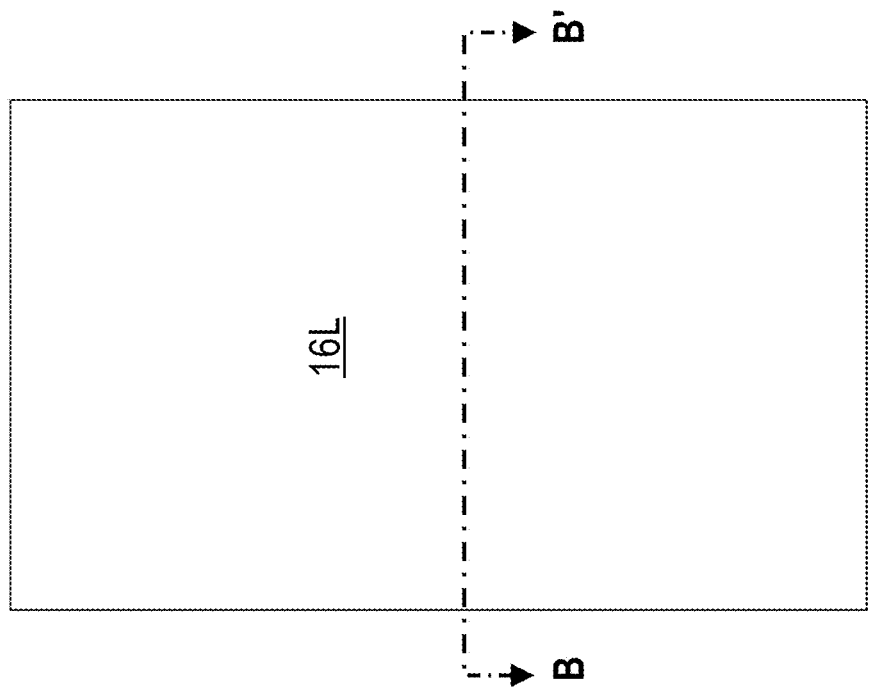
FIG. 1B
FIG. 1A

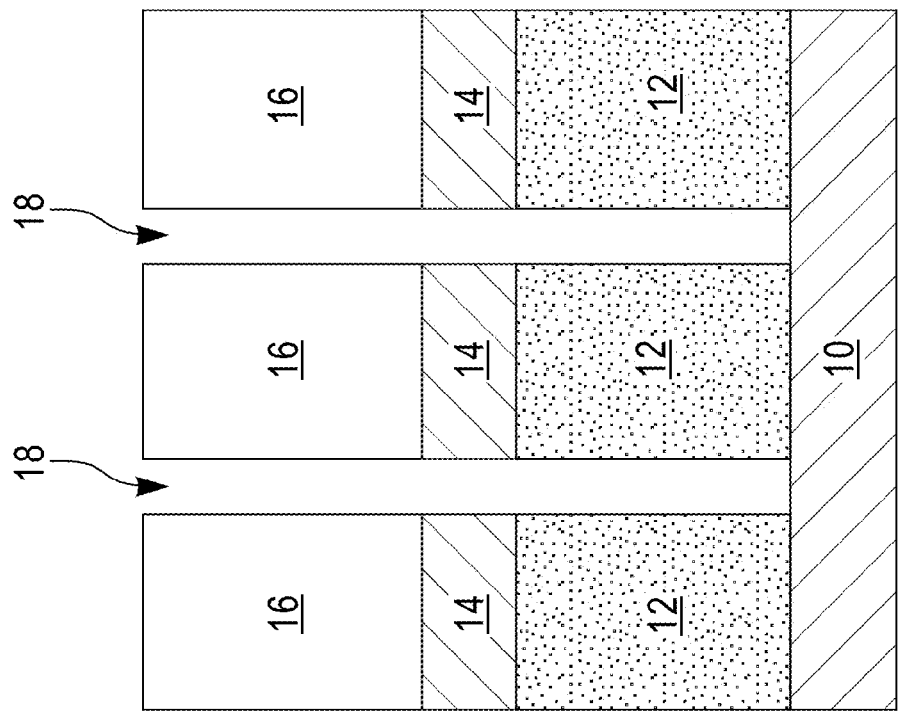
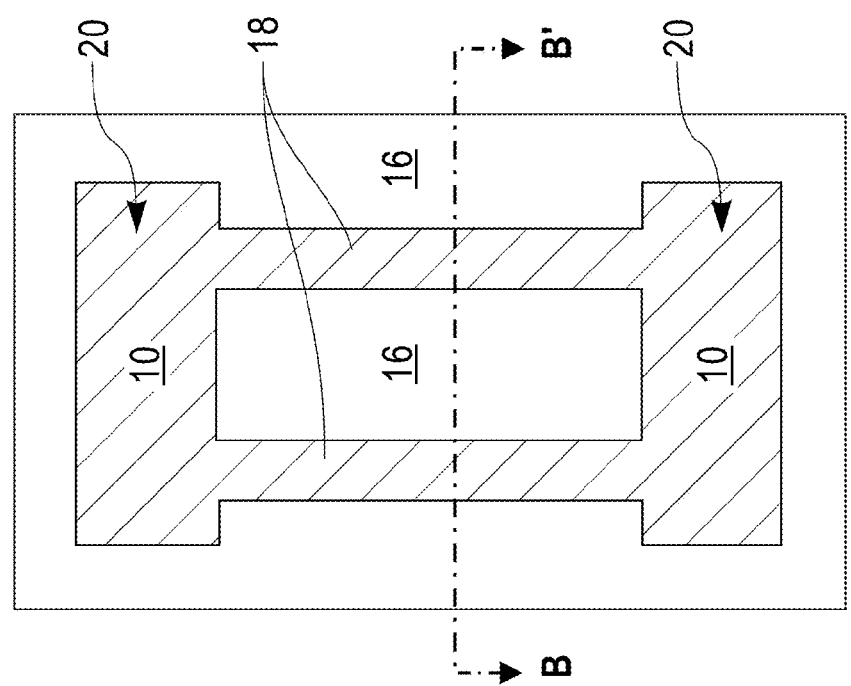
FIG. 2B
FIG. 2A

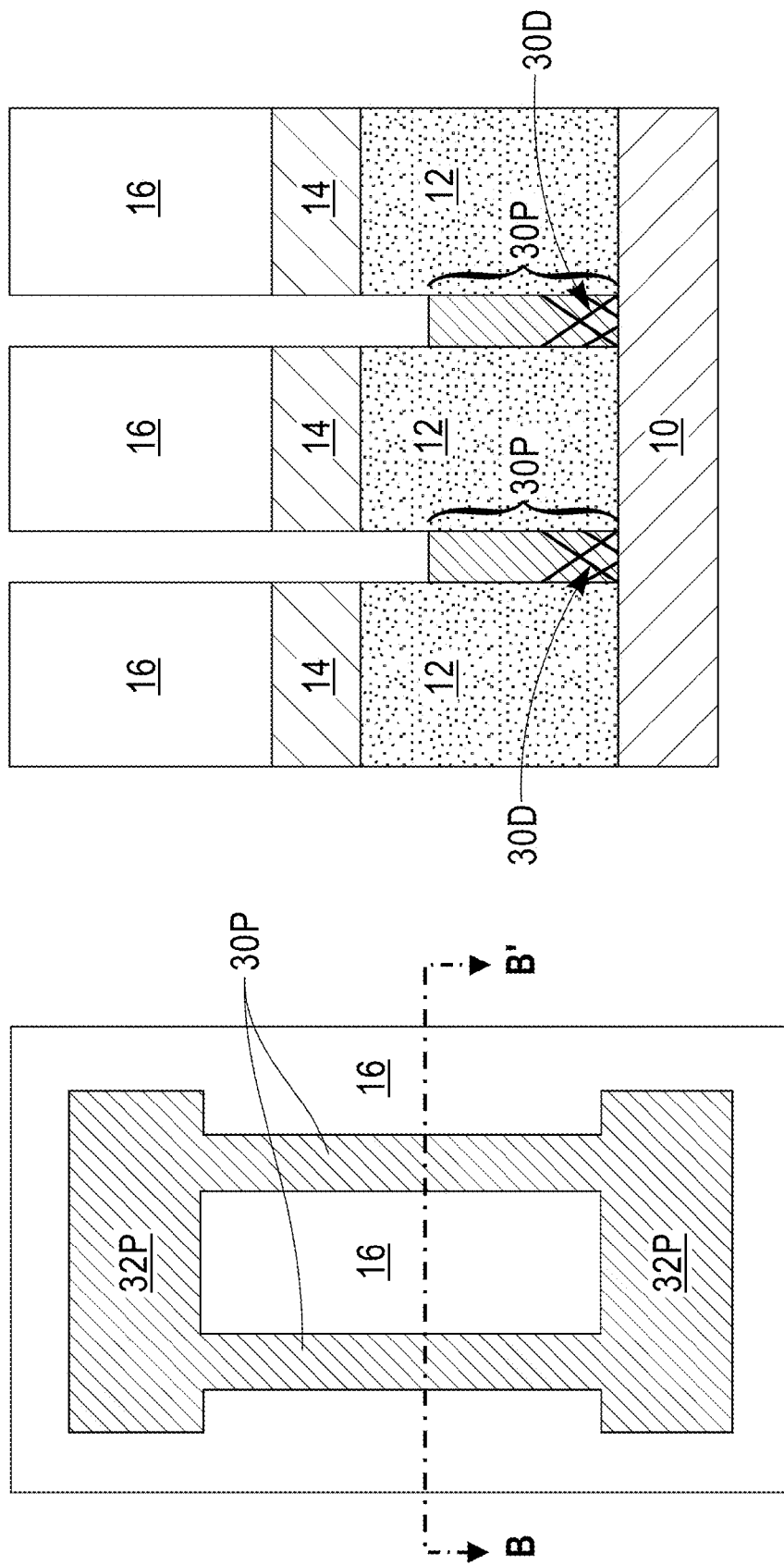

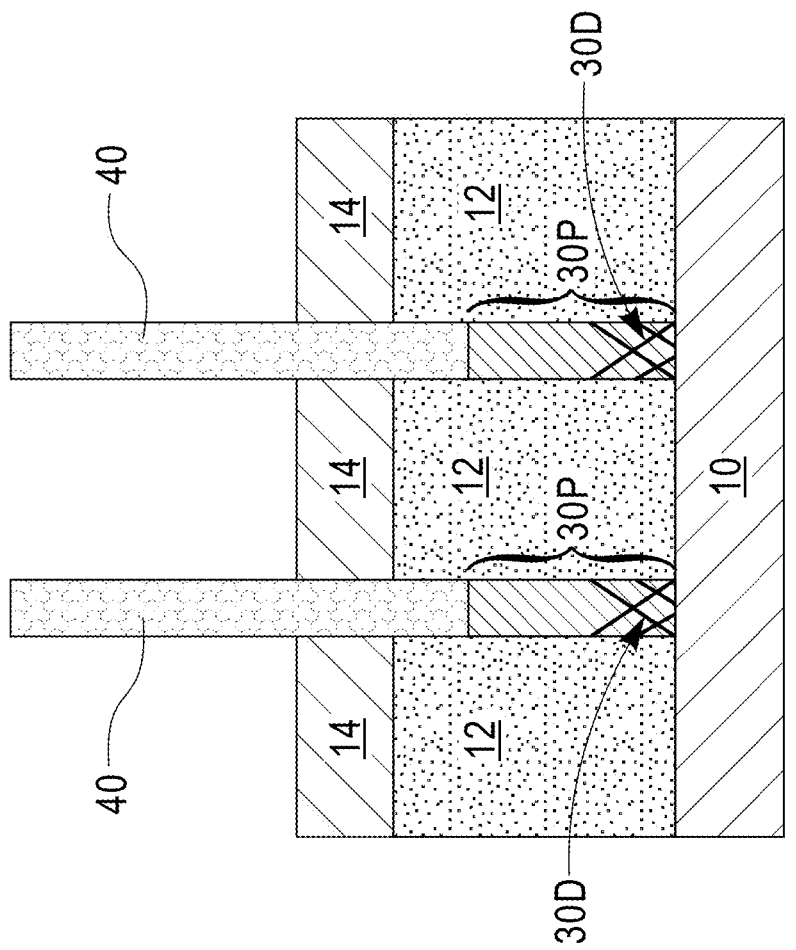
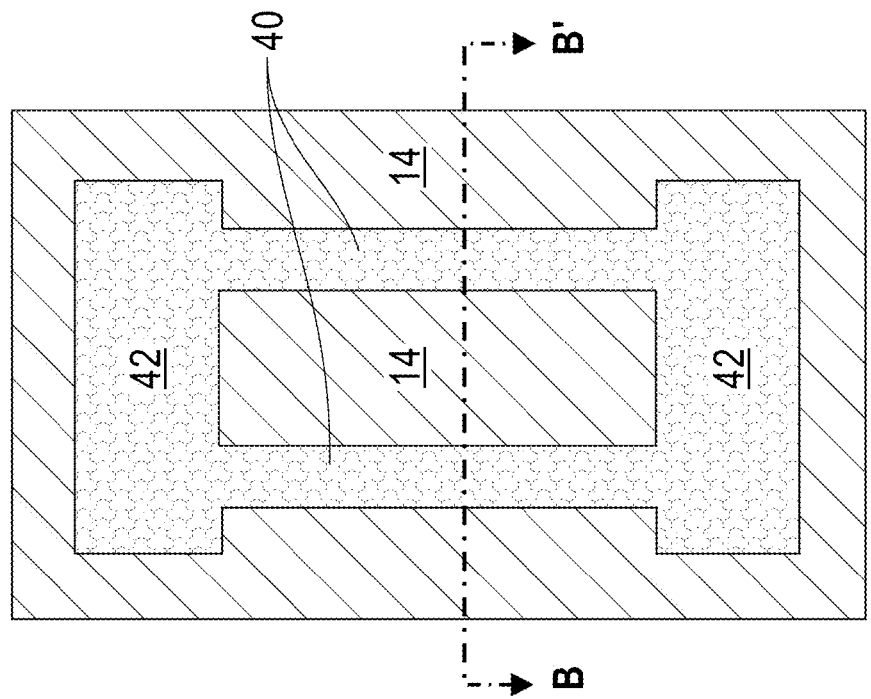
FIG. 6B
FIG. 6A

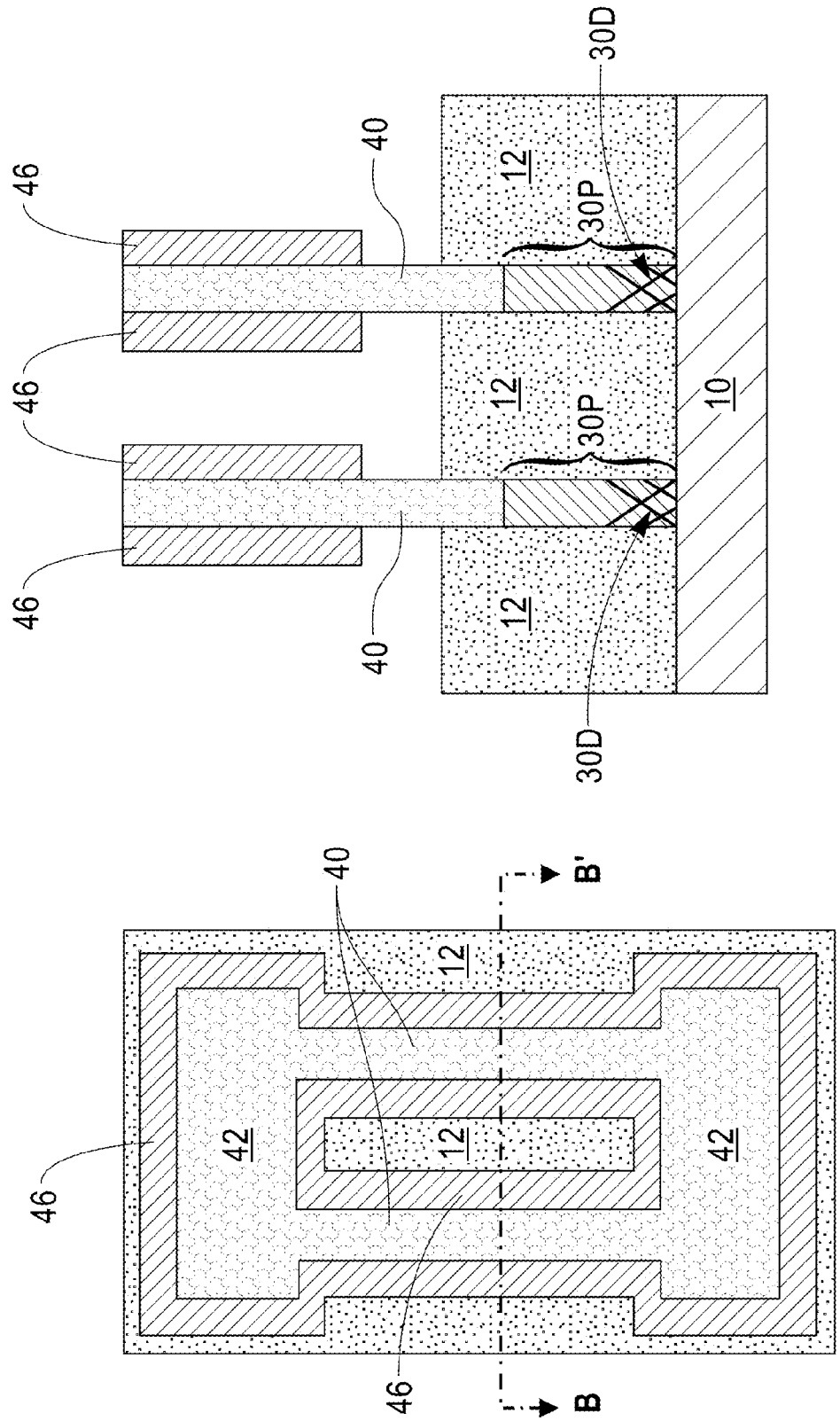

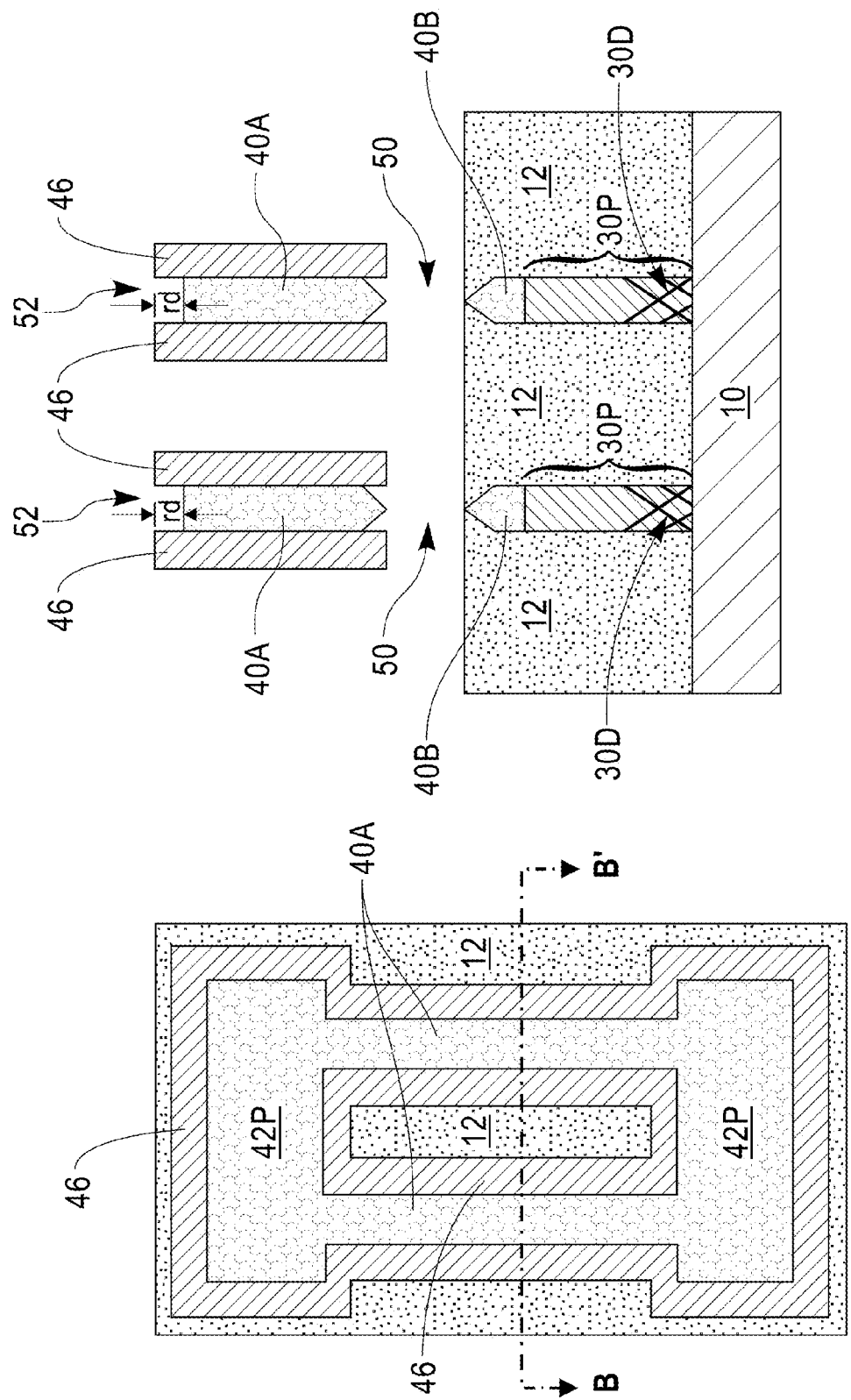

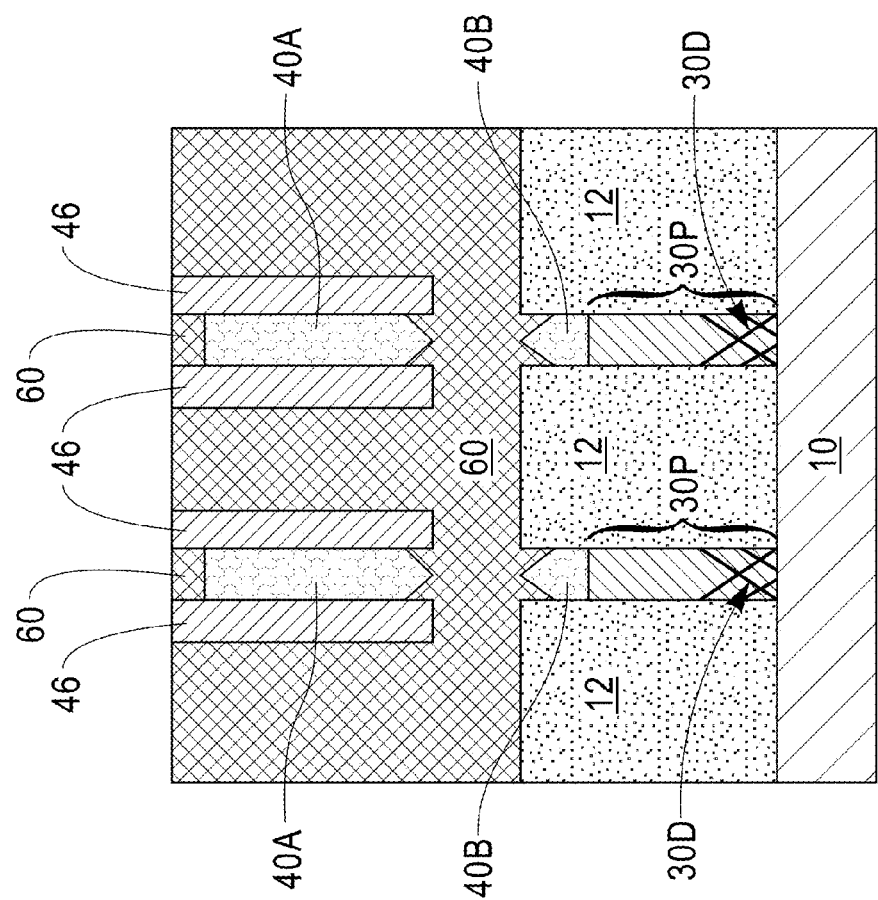
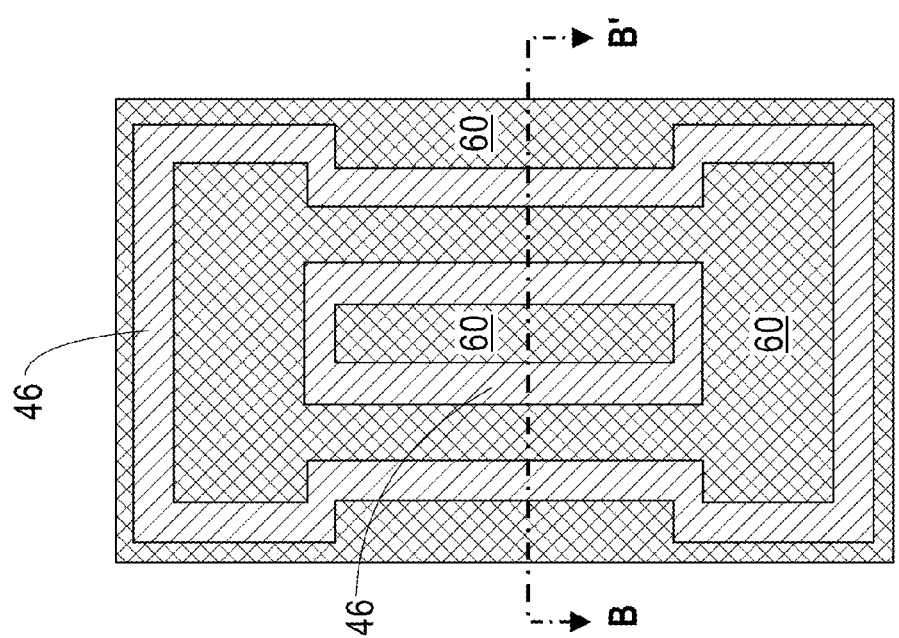
FIG. 10B
FIG. 10A

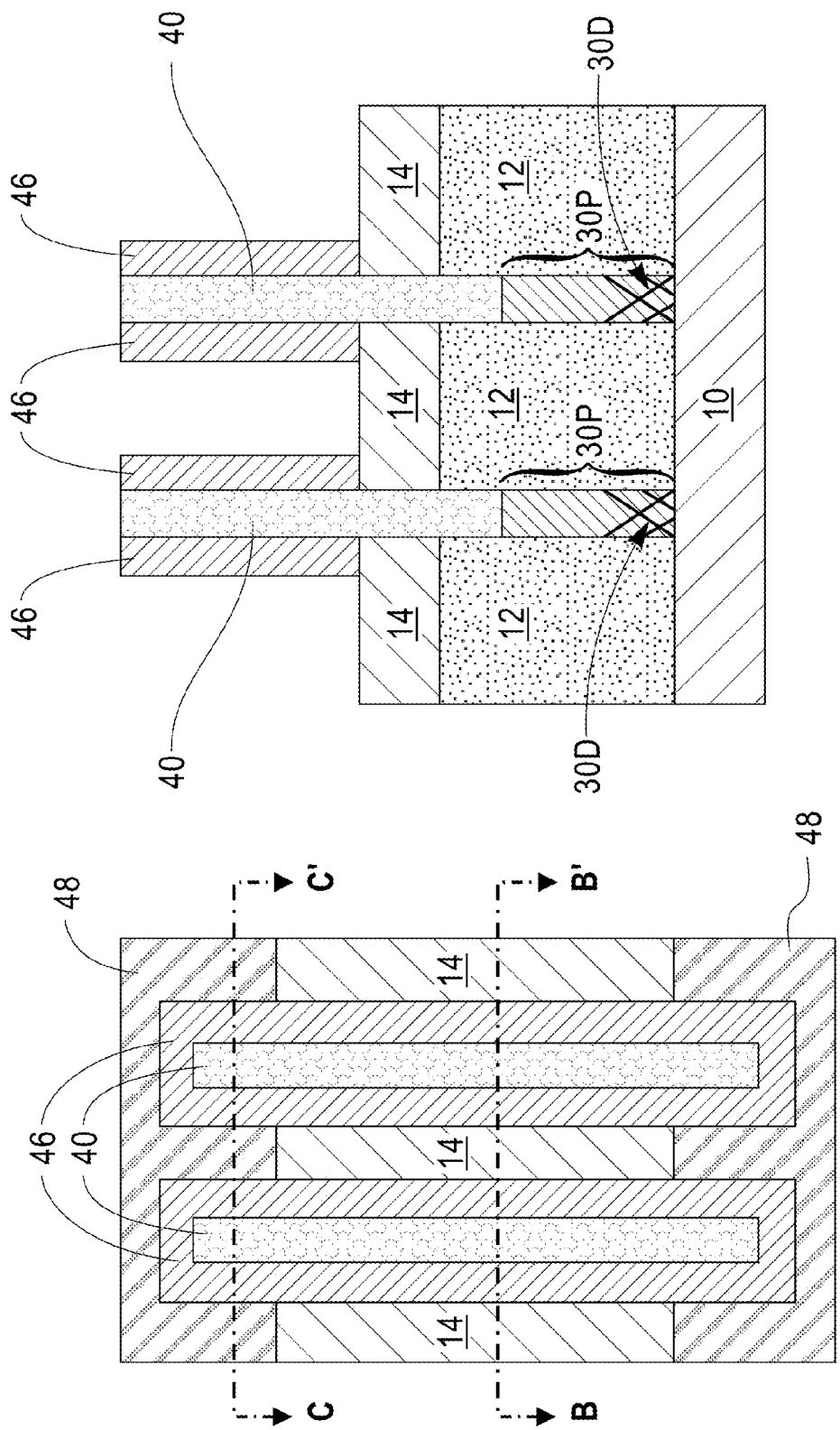

PRECISELY CONTROLLING III-V HEIGHT

BACKGROUND

The present application relates to semiconductor device fabrication, and more particularly, to the fabrication of III-V compound semiconductor fin field effect transistors (FinFETs) with improved fin height control.

III-V compound semiconductors are promising channel materials for n-channel transistors in complementary metal-oxide semiconductor (CMOS) circuits due to their high electron mobility as compared to current silicon-based channel. Aspect ratio trapping (ART) has been explored as a viable approach to grow high quality III-V compound semiconductor fins in trenches by trapping defects at lower trench portions. Typically a III-V compound semiconductor fin (e.g., InGaAs) grown by ART requires first growing an insulating or semi-insulating III-V compound material fin (e.g., InP) and then recessing the insulating or semi-insulating III-V compound material fin followed by III-V compound semiconductor fin growth.

However, because the etch rate across the wafer is typically not uniform, the non-uniform etch rate causes height variations in the recessed insulating or semi-insulating III-V compound material fin, which, in turn, can lead to significant height variations in the III-V compound semiconductor fins subsequently formed thereon. The non-uniform channel fin heights can result in significant variations in device performance. Therefore, methods that allow better control of fin heights in forming III-V compound semiconductor fins by ART remain needed.

SUMMARY

The present application provides methods that allow better control of fin heights in forming III-V compound semiconductor fins by aspect ratio trapping (ART). After forming trenches extending through a dielectric material stack including, from bottom to top, a first dielectric layer, a second dielectric layer and a third dielectric layer that is located over a semiconductor substrate, a fin stack of, from bottom to top, an insulating III-V compound material fin portion and a III-V compound semiconductor fin is formed within each trench. The third dielectric layer is removed to expose a first portion of each III-V compound semiconductor fin. After forming a sidewall spacer on sidewalls of the first portion of each III-V compound semiconductor fin, the second dielectric layer is removed to expose a second portion of each III-V compound semiconductor fin. The exposed second portion of each III-V compound semiconductor fin is removed. The remaining first portion of each III-V compound semiconductor fin constitutes an active portion over which a FinFET is subsequently formed. The height variations in the insulating III-V compound material fin portion thus have no impact on the device performance.

In one aspect of the present application, a semiconductor structure is provided. In one embodiment, the semiconductor structure includes a fin stack of, from bottom to top, an insulating III-V compound material fin portion and an embedded III-V compound semiconductor fin portion located over a semiconductor substrate and laterally surrounded by a dielectric layer, an insulator portion located over the dielectric layer and the embedded III-V compound semiconductor fin portion, and a channel III-V compound semiconductor fin portion located over the insulator portion.

In another embodiment, the semiconductor structure includes a fin stack of, from bottom to top, an insulating III-V compound material fin portion and an embedded III-V compound semiconductor fin portion located over a semiconductor substrate and laterally surrounded by a dielectric layer; an insulating III-V compound material portion located over the embedded III-V compound semiconductor fin portion and laterally surrounded by an insulator portion, and a channel III-V compound semiconductor fin portion located over the insulating III-V compound material portion.

In another aspect of the present application, a method of forming a semiconductor structure is provided. The method includes forming a trench extending through a dielectric material stack of, from bottom to top, a first dielectric layer, a second dielectric layer and a third dielectric layer located over a semiconductor substrate. A fin stack of, form bottom to top, an insulating III-V compound material fin portion and a III-V compound semiconductor fin is then within the trench. A top surface of the insulating III-V compound material fin portion is located below a top surface of the first dielectric layer. After removing the third dielectric layer to expose sidewalls of a first portion of the III-V compound semiconductor fin located above the second dielectric layer, a sidewall spacer is formed over the exposed sidewalls of the first portion of the III-V compound semiconductor fin. Next, the second dielectric layer is removed to expose a second portion of the III-V compound semiconductor fin. Next, the exposed second portion of the III-V compound semiconductor fin is removed to provide an opening that separates the first portion of the III-V compound semiconductor fin from a bottom portion of the III-V compound semiconductor fin that is embedded in the first dielectric layer.

BRIEF DESCRIPTION OF SEVERAL VIEWS OF THE DRAWINGS

FIG. 1A is a top down view of a first exemplary semiconductor structure including a dielectric material stack that includes, from bottom to top, a first dielectric layer, a second dielectric layer and a third dielectric layer located over a semiconductor structure that can be employed according to a first embodiment of the present application.

FIG. 1B is a cross sectional view of the first exemplary semiconductor structure of FIG. 1A along vertical plane B-B'.

FIG. 2A is a top down view of the first exemplary semiconductor structure of FIGS. 1A-1B after forming trenches extending through the dielectric material stack.

FIG. 2B is a cross sectional view of the first exemplary semiconductor structure of FIG. 2A along vertical plane B-B'.

FIG. 4A is a top down view of the first exemplary semiconductor structure of FIGS. 3A-3B after recessing the insulating III-V compound martial fin to provide an insulating III-V compound material fin portion having a top surface located below a top surface of the first dielectric layer.

FIG. 4B is a cross sectional view of the first exemplary semiconductor structure of FIG. 4A along vertical plane B-B'.

FIG. 6A is a top down view of the first exemplary semiconductor structure of FIGS. 5A-5B after removing the third dielectric layer to expose a first portion of each III-V compound semiconductor fin.

FIG. 6B is a cross sectional view of the first exemplary semiconductor structure of FIG. 6A along vertical plane B-B'.

FIG. 8A is a top down view of the first exemplary semiconductor structure of FIGS. 7A-7B after removing the second dielectric layer to expose a second portion of each III-V compound semiconductor fin.

FIG. 8B is a cross sectional view of the first exemplary semiconductor structure of FIG. 8A along vertical plane B-B'.

FIG. 9A is top down view of the first exemplary semiconductor structure of FIGS. 8A-8B after removing the second portion of each III-V compound semiconductor fin to provide an opening that separate each III-V compound semiconductor fin into a channel III-V compound semiconductor fin portion and an embedded III-V compound semiconductor fin portion.

FIG. 9B is a cross sectional view of the first exemplary semiconductor structure of FIG. 9A along vertical plane B-B'.

FIG. 10A is a top down view of the first exemplary semiconductor structure of FIGS. 9A-9B after forming an insulator layer over the first dielectric layer and each embedded III-V compound semiconductor fin portion to laterally surround the sidewall spacer.

FIG. 10B is a cross sectional view of the first exemplary semiconductor structure of FIG. 10A along vertical plane B-B'.

FIG. 12A is a top down view of a variation of the first exemplary semiconductor structure of FIGS. 11A-11B after forming an anchoring structure on an end portion of each III-V compound semiconductor fin.

FIG. 12B is a cross sectional view of the variation of the first exemplary semiconductor structure of FIG. 12A along vertical plane B-B'.

DETAILED DESCRIPTION

Figure 3B:
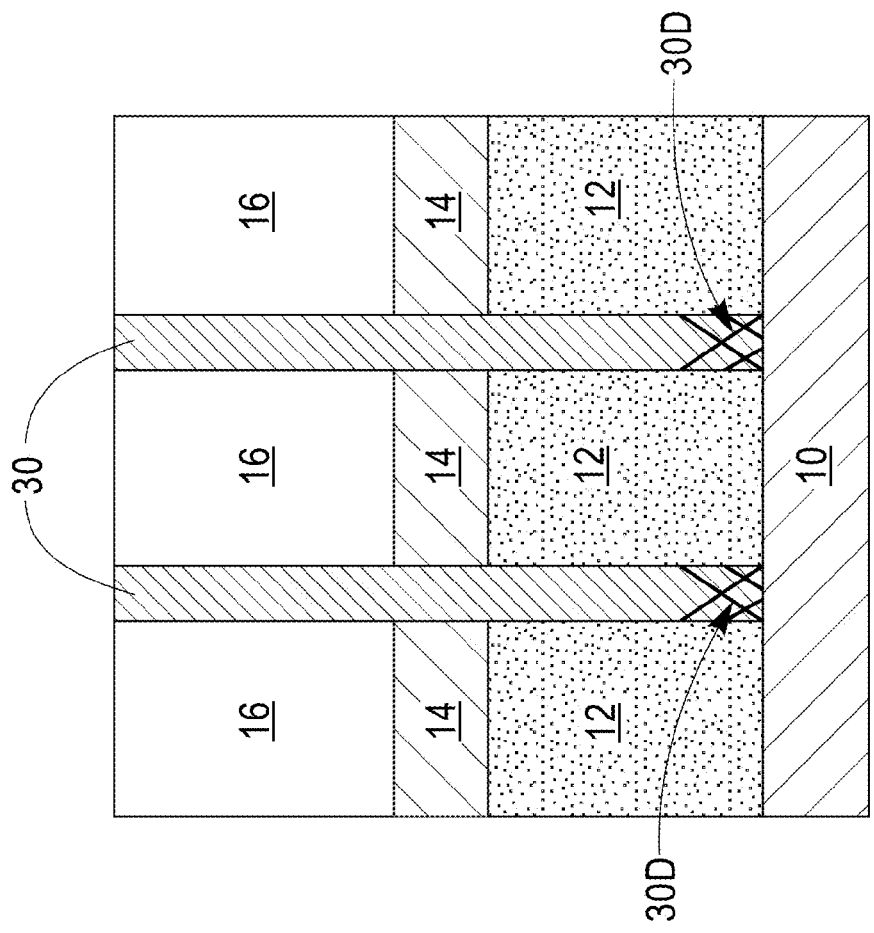
FIG. 3B is a cross sectional view of the first exemplary semiconductor structure of FIG. 3A along vertical plane B-B'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A-1B, a first exemplary semiconductor structure that can be employed according to a first embodiment of the present application includes a semiconductor substrate 10 and a dielectric material stack formed thereon. The dielectric material stack includes, from bottom to top, a first dielectric layer 12, a second dielectric layer 14 and a third dielectric layer 16.

The semiconductor substrate 10 may be composed of a group IV semiconductor-containing material including, but not limited to, silicon (Si), germanium (Ge), silicon germanium (SiGe) and silicon carbide (SiC). The semiconductor substrate 10 is typically single crystalline and is generally intrinsic (i.e., non-doped). In one embodiment, the semiconductor substrate 10 includes single crystalline silicon. Although the semiconductor substrate 10 is depicted as a bulk semiconductor substrate, semiconductor-on-insulator (SOI) substrate arrangements, such as silicon-on-insulator substrates, are also suitable for the semiconductor substrate 10.

The first dielectric layer 12 that is formed on the semiconductor substrate 10 may be composed of any dielectric material, such as oxides, nitrides or oxynitrides. In one embodiment, the first dielectric layer 12 is composed of a dielectric nitride such as, for example, silicon nitride or boron nitride. The first dielectric layer 12 may be formed using a deposition process including, but not limited to, chemical vapor deposition (CVD), plasma enhanced chemical vapor deposition CVD (PECVD) or physical vapor deposition (PVD). Alternatively, the first dielectric layer 12 may be formed by thermal nitridation and/or thermal oxidation. The first dielectric layer 12 that is formed may have a thickness ranging from 10 nm to 100 nm, although lesser and greater thicknesses can also be employed.

The second dielectric layer 14 that is formed on the first dielectric layer 12 may comprises a dielectric material that can be selectively removed relative to the dielectric material providing the first dielectric layer 12. In one example, and when the first dielectric layer 12 comprises silicon nitride, then the second dielectric layer 14 comprises silicon dioxide. The second dielectric layer 14 can be formed utilizing CVD, PECVD or PVD. The second dielectric layer 14 that is formed may have a thicknesses ranging from 10 to 20 nm, although lesser and greater thicknesses can also be employed.

The third dielectric layer 16 that is formed on the second dielectric layer 14 may be composed of a dielectric material that can be selectively removed relative to the dielectric material providing the second dielectric layer 14. In one example, and when the second dielectric layer 14 comprises silicon dioxide, then the third dielectric layer 16 comprises silicon nitride or silicon oxynitride. Similar to the first dielectric layer 12 and the second dielectric layer 14, the third dielectric layer 16 may be formed using CVD, PECVD or PVD. The third dielectric layer 16 that is formed may have a thickness ranging from 20 nm to 50 nm, although lesser and greater thicknesses can also be employed.

Referring to FIGS. 2A-2B, trenches 18 are formed extending through the dielectric material stack (12, 14, 16) to expose a surface of the semiconductor substrate 10; although a plurality of trenches is shown and described, the present application also contemplates an embodiment in which a single trench is formed. The trenches 18 dictate the positions in which active fin structures can be subsequently formed. Each trench 18 that is formed may have an aspect ratio (i.e., trench width to trench height) ranging from 1:3 to 1:10. Other aspect ratios are possible as long as the trench height is at least 2 times greater than the trench width. In one embodiment, the trenches 18 may have a width ranging from 2 nm to 20 nm and a height ranging from 20 nm to 200 nm.

In one embodiment and as shown in FIG. 2A, a pair of end trenches 20 that are attached to the ends of the trenches 18 may be formed. The end trenches 20 have a lengthwise direction that is perpendicular to the lengthwise direction of the trenches 18. The width of each end trench 20 is configured to be greater than a width of each trench 18. The end trenches 20 are optional and can be omitted in some embodiments of the present application.

The trenches 18 and, if present, the end trenches 20 can be formed, for example, by lithography and etching. Lithography includes forming a photoresist layer (not shown) over a topmost surface of the dielectric material stack (12, 14, 16), i.e., a top surface of the third dielectric layer 16. The photoresist layer may include a positive-tone photoresist composition, a negative-tone photoresist composition or a hybrid-tone photoresist composition. The photoresist layer may be formed by a deposition process such as, for example, spin coating. After forming the photoresist layer, the photoresist layer is subjected to a pattern of irradiation. Next, the exposed photoresist material is developed utilizing a conventional resist developer. This provides a patterned photoresist layer atop portions of the third dielectric layer 16. The pattern in the patterned photoresist layer is thereafter transferred into the underlying dielectric material stack (12, 14, 16). The pattern transfer may be achieved by utilizing at least one etch process that removes dielectric materials providing the first dielectric layer 12, the second dielectric material layer 14L and the third dielectric material layer 16 selective to the semiconductor material providing the semiconductor substrate 10. In one embodiment, the etch process that etches the dielectric material stack (12, 14, 16) is an anisotropic etch. The anisotropic etch may include dry etch such as, for example, reactive ion etch (RIE) or wet etch involving a chemical etchant. Upon completion of the pattern transfer, the patterned photoresist layer can be removed utilizing any conventional resist stripping process such as, for example, ashing.

Figure 3A:
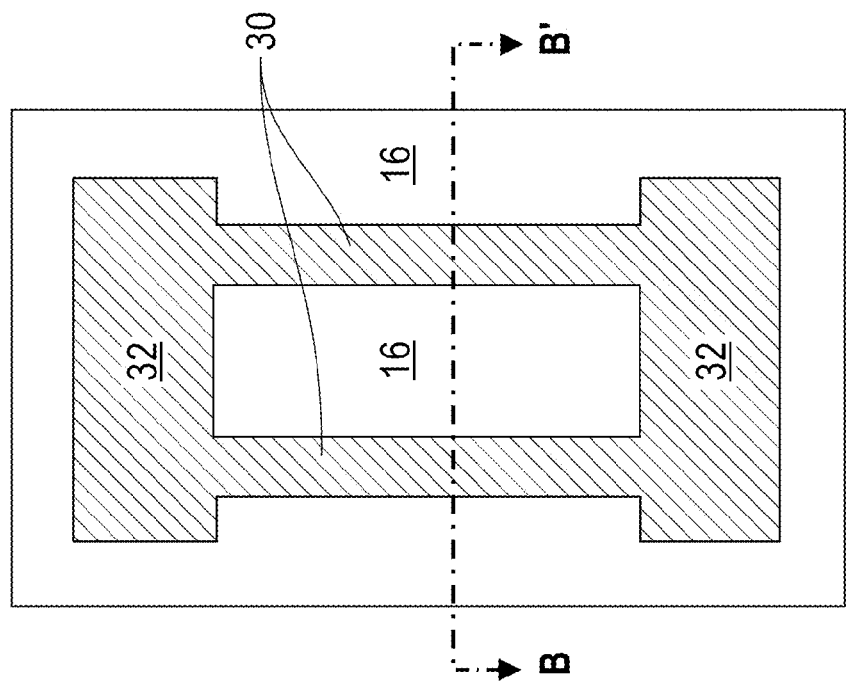
FIG. 3A is a top down view of the first exemplary semiconductor structure of FIGS. 2A-2B after forming an insulating III-V compound material fin within each trench.

Referring to FIGS. 3A-3B, an insulating III-V compound material is deposited in the trenches 18 and, if present, end trenches 20 to form an insulating III-V compound material fin 30 within each trench 18 and an insulating III-V compound material pad 32 within each end trench 20. The term "insulating III-V compound material" denotes an insulating or semi-insulating material that has insulating properties and includes at least one element from Group III (i.e., B, Al, Ga, and/or In) of the Periodic Table of Elements and at least one element from Group V (i.e., N, P, As, Sb and/or Bi) of the Periodic Table of Elements. The bandgap of the insulating III-V compound material may be, for example, greater than 1.3 eV. Exemplary insulating III-V compound materials that can be employed in the present application include, but are not limited to, InP and InAlAs.

The insulating III-V compound material fins 30 and the insulating III-V compound material pads 32, if present, can be formed utilizing an epitaxial growth (or deposition) process such as the epitaxial regrowth process disclosed in U.S. Patent Application Publication No. 2011/0049568 to Lochtefeld et al., the entire content of which is incorporated herein by reference. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Exemplary epitaxial growth process that can be employed in the present application include, but are not limited to rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C.

During the epitaxial growth, the insulating III-V compound material is deposited only over the semiconductor surface, i.e., the top surface of the semiconductor substrate 10 that is exposed by the trenches 18 and the end trenches 20, and does not grow on dielectric surfaces, such as surfaces of the first, the second and the third dielectric layers 12, 14, 16. Each of the insulating III-V compound material fins 30 and the insulating III-V compound material pads 32 thus formed has an epitaxial relationship, i.e., same crystal orientation, with the underlying semiconductor substrate 10. As is shown, each of the insulating III-V compound material fins 30 and insulating III-V compound material pads 32 that are formed has a top surface that is coplanar with the top surface of the third dielectric layer 16 and a bottom surface that is in direct contact with the top surface of the semiconductor substrate 10.

Because of the aspect ratio of the trenches 18, the defects within each insulating III-V compound material fin 30 are trapped along the sidewalls of first dielectric layer 12, forming a defect-containing region 30D at a lower portion of each trench 18. Accordingly, the upper portion of each insulating III-V compound material fin 30 is substantially exhausted of defects; i.e., "substantially defect-free". A density of such defects in the upper portion of each insulating III-V compound material fin 30 may be less than, for example, $10^6$ defects/cm$^2$, preferably less than $10^3$ defects/cm$^2$.

Referring to FIGS. 4A-4B, each of the insulating III-V compound material fins 30 and insulating III-V compound material pads 32 is recessed to a depth that is greater than the total thickness of the third dielectric layer 16 and the second dielectric layer 14. Accordingly, a top surface of a remaining portion of each of the insulating III-V compound material fins 30 and insulating III-V compound material pads 32 is vertically offset and located beneath a top surface of the first dielectric layer 12. The remaining portion of each insulating III-V compound material fin 30 is herein referred to as an insulating III-V compound material fin portion 30P, and the remaining portion of each insulating III-V compound material pad 32 is herein referred to as an insulting III-V compound material pad portion 32P. As is shown, each insulating III-V compound material fin portion 30P includes a defect-containing region 30D and a remaining portion of an upper portion of the insulating III-V compound material fin 30 having a defect density lower than that of the defect-containing region 30D.

The recessing of each of the insulating III-V compound material fins 30 and insulating III-V compound material pads 32 can be performed utilizing an etch process that removes the insulating III-V compound material selective to the dielectric materials of the first, second and third dielectric layers 12, 14, 16. In one embodiment, the insulating III-V compound material can be etched by RIE using a chorine based etchant.

In one embodiment, the etch rate variation causes non-uniform etching of the insulating III-V compound material fins 30 and insulating III-V compound material pads 32 in the exemplary structure. As is shown, and after etching, the heights of insulating III-V compound material fin portions 30P vary. Although not shown, the heights of insulating III-V compound material pad portions 32P also vary.

Figure 5B:
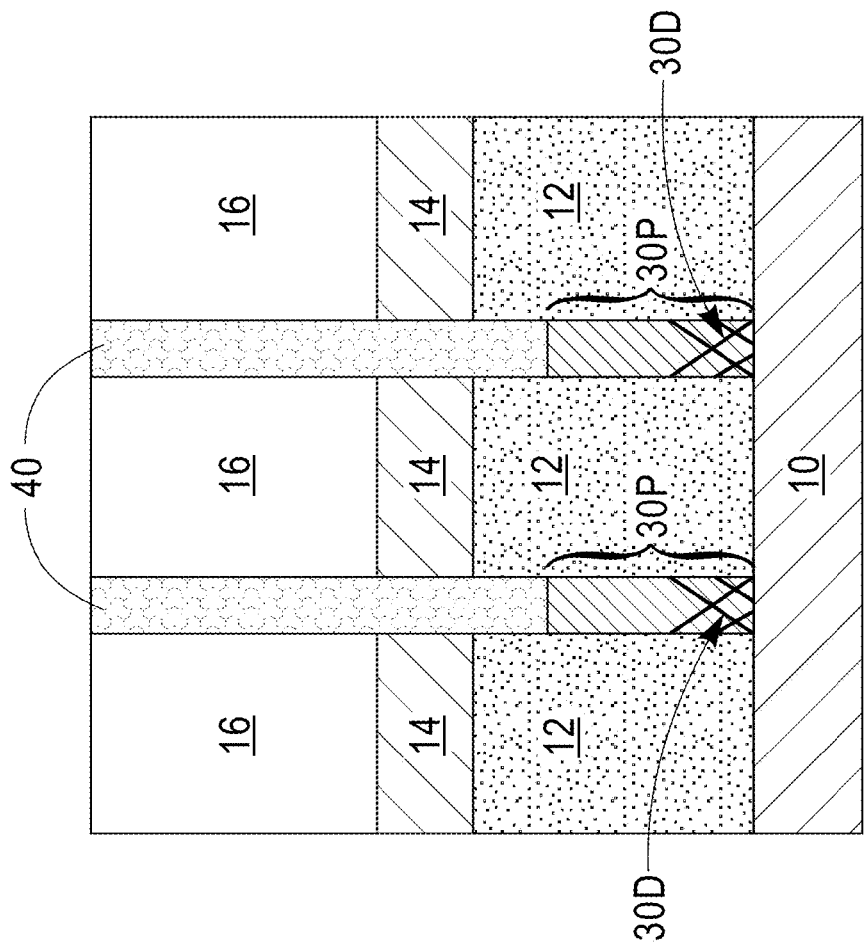
FIG. 5B is a cross sectional view of the first exemplary semiconductor structure of FIG. 5A along vertical plane B-B'.
Figure 5A:
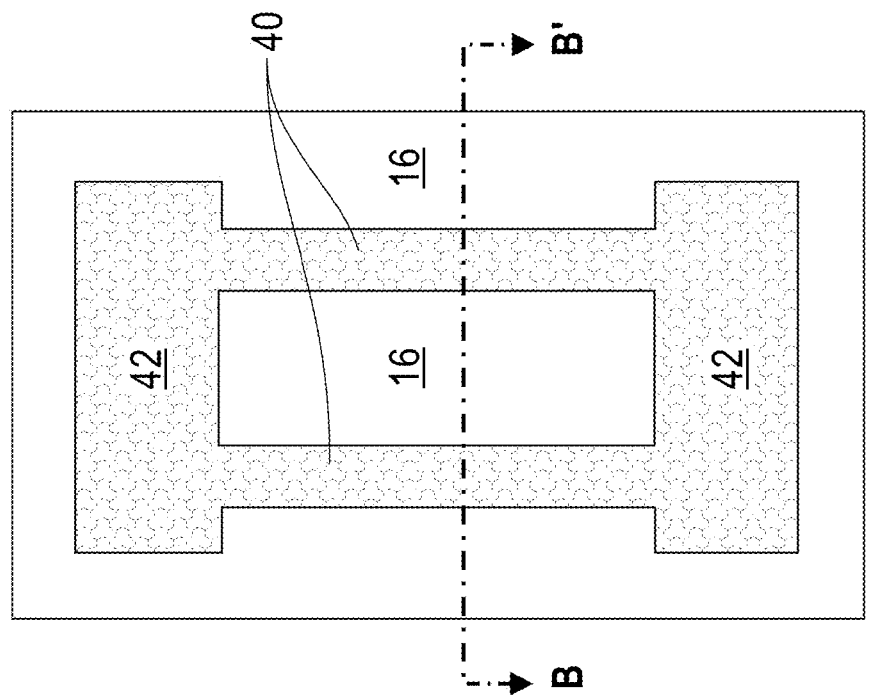
FIG. 5A is a top down view of the first exemplary semiconductor structure of FIGS. 4A-4B after forming a III-V compound semiconductor fin over each insulating III-V compound material fin portion.

Referring to FIGS. 5A-5B, a III-V compound semiconductor fin 40 is formed on a top surface of each insulating III-V compound material fin portion 30P and a III-V compound semiconductor pad 42 is formed on a top surface of each insulating III-V compound material pad portion 32P. Within each vertical fin stack of a insulating III-V compound material fin portion 30P and a III-V compound semiconductor fin 40, sidewalls of the III-V compound semiconductor fin 40 are vertically coincident with sidewalls of the insulating III-V compound material fin portion. As used herein, two surfaces are "vertically coincident" if there exists a vertical plane including the two surfaces.

The term "III-V compound semiconductor" denotes a semiconductor material that has semiconductor properties and includes at least one element from Group III (i.e., B, Al, Ga, and/or In) of the Periodic Table of Elements and at least one element from Group V (i.e., N, P, As, Sb and/or Bi) of the Periodic Table of Elements. The range of possible formulae is quite broad because the elements can form binary compound semiconductors, tertiary compound semiconductors and even quaternary compound semiconductors.

The III-V compound semiconductor material that provides the III-V compound semiconductor fins 40 and III-V compound semiconductor pads 42 may have a band gap smaller than that of the insulating III-V compound material providing the insulating III-V compound material fin portions 30P and insulating III-V compound material pad portions 32P. In one embodiment, the band gap of the III-V compound semiconductor material can be, for example, from 0.3 eV to 1.3 eV. Exemplary III-V compound semiconductor materials that can be employed in the present application include, but at not limited to, InAs, InGaAs, InGaSb and GaAs.

The III-V compound semiconductor fins 40 and III-V compound semiconductor pads 42 can be formed by one of the epitaxial growth processes mentioned above in forming the insulating III-V compound material fins 30 and insulating III-V compound material pads 32. Since an epitaxial growth process is used in forming the III-V compound semiconductor fins 40 and III-V compound semiconductor pads 42, each III-V compound semiconductor fin 40 is in epitaxial relation with an underlying insulating III-V compound material fin portion 30P and each III-V compound semiconductor pad 42 is in epitaxial relation with an underlying insulating III-V compound material pad portion 32P. In some embodiments, and following the epitaxial growth process, an etch back or planarization process can be used such that the top surfaces of the III-V compound semiconductor fins 40 and III-V compound semiconductor pads 42 can be coplanar with the top surface of the third dielectric layer 16.

Referring to FIGS. 6A-6B, the third dielectric layer 16 is removed by an anisotropic etch or isotropic etch that removes the dielectric material of the third dielectric layer 16 selective to the III-V compound semiconductor material that provides the III-V compound semiconductor fins 40 and III-V compound semiconductor pads 42 and the dielectric material that provides the second dielectric layer 14. In one embodiment, and when the third dielectric layer 16 is composed of silicon nitride and the second dielectric layer 14 is composed of silicon dioxide, the third dielectric layer 16 may be removed by RIE or a wet etchant containing hot phosphoric acid. The removal of the third dielectric layer 16 exposes sidewalls of first portions of the III-V compound semiconductor fins 40 and III-V compound semiconductor pads 42 that are located above the top surface of the second dielectric layer 14; other portions of the III-V compound semiconductor fins 40 and III-V compound semiconductor pads 42 remain protected by the second dielectric layer 14 and the first dielectric layer 12.

Figure 7B:
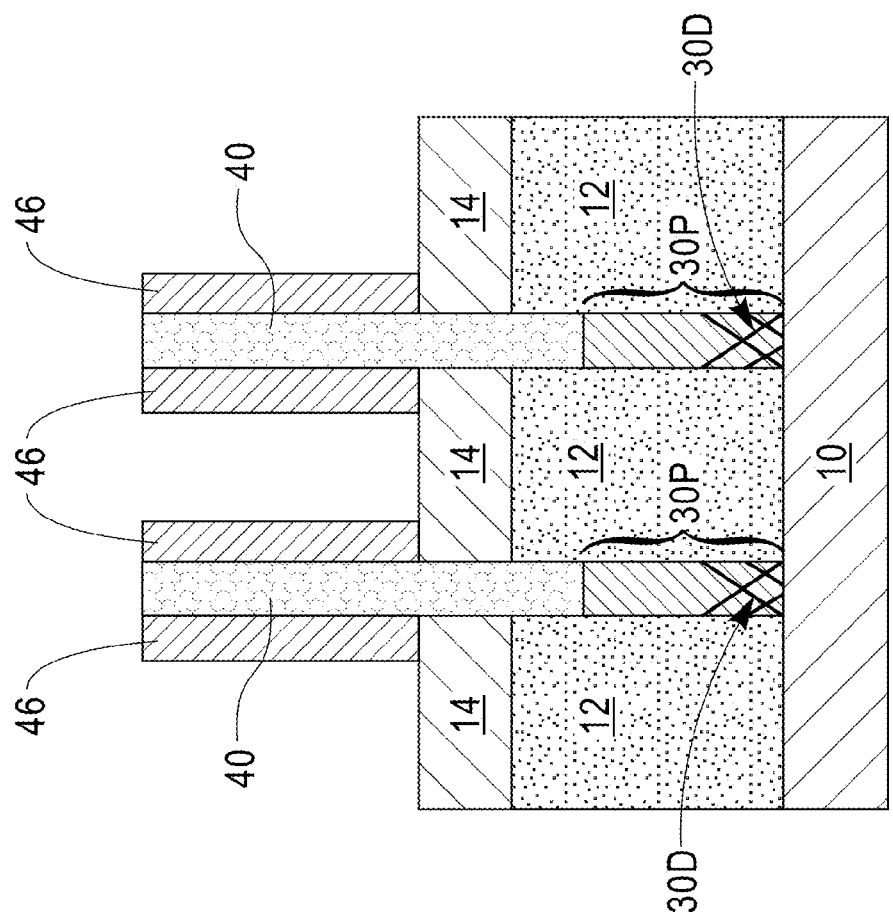
FIG. 7B is a cross sectional view of the first exemplary semiconductor structure of FIG. 7A along vertical plane B-B'.
Figure 7A:
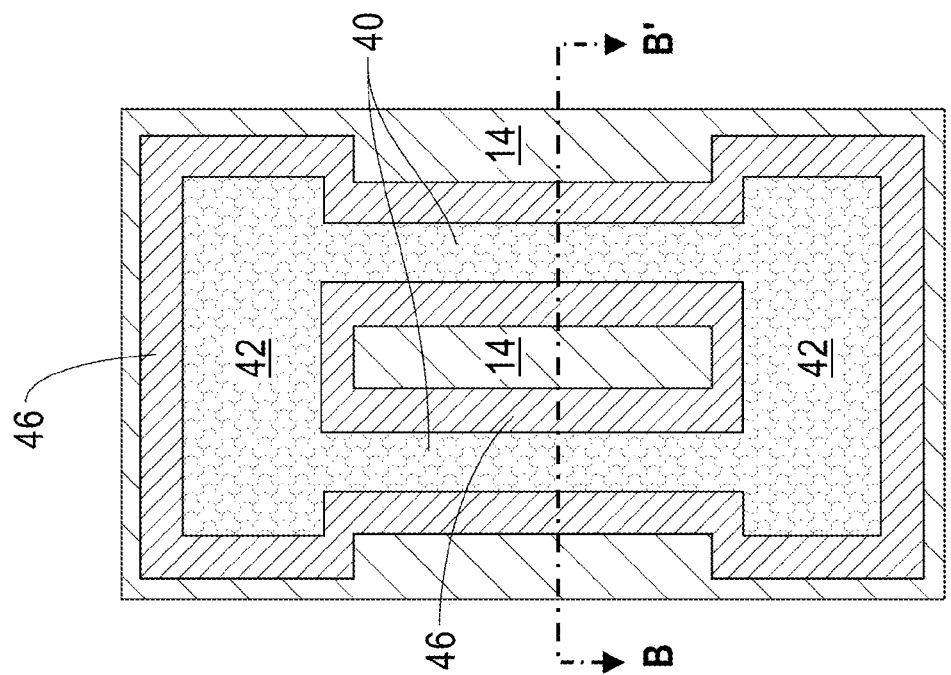
FIG. 7A is a top down view of the first exemplary semiconductor structure of FIGS. 6A-6B after forming a sidewall spacer over sidewalls of the first portion of each III-V compound semiconductor fin.

Referring to FIGS. 7A-7B, a sidewall spacer 46 is formed on the exposed sidewalls of the first portions of the III-V compound semiconductor fins 40 and III-V compound semiconductor pads 42. The sidewall spacer 46 may be formed of a dielectric material having a high etching selectivity with respect to the second dielectric layer 14. For example, and when the second dielectric layer 14 is composed of silicon dioxide, the sidewall spacer 46 can include silicon nitride or silicon oxynitride. The sidewall spacer 46 may be formed, for example, by depositing a conformal spacer material layer (not shown) on the physically exposed surfaces of the first portions of the III-V compound semiconductor fins 40 and III-V compound semiconductor pads 42, and anisotropically etching the conformal spacer material layer. Horizontal portions of the conformal spacer material layer are removed by the anisotropic etch, and the remaining vertical portions of the conformal spacer material layer present on the sidewalls of the first portions of the III-V compound semiconductor fins 40 and III-V compound semiconductor pads 42 constitute the sidewall spacer 46. The sidewall spacer 46 laterally surrounds the first portions of the III-V compound semiconductor fins 40 and III-V compound semiconductor pads 42.

Referring to FIGS. 8A-8B, the second dielectric layer 14 is removed by an isotropic etch that removes the dielectric material of the second dielectric layer 14 selective to the III-V compound semiconductor material providing the III-V compound semiconductor fins 40 and III-V compound semiconductor pads 42 and the dielectric materials providing the first dielectric layer 12 and the sidewall spacer 46. In one embodiment, and when each of the first dielectric layer 12 and the sidewall spacer 46 is composed of silicon nitride and the second dielectric layer 14 is composed of silicon dioxide, the second dielectric layer 14 may be removed by hydrofluoric acid (HF) or a buffered oxide etchant including ammonium fluoride ($NH_4F$) and HF. The removal of second dielectric layer 14 expose sidewalls of a second portion of each of the III-V compound semiconductor fins 40 and III-V compound semiconductor pads 42 that is located between a bottom surface of the sidewall spacer 46 and the top surface of the first dielectric layer 12. After removal of the second dielectric layer 14, the first portions of the III-V compound semiconductor fins 40 and III-V compound semiconductor pads 42 remain protected by the sidewall spacer 46, while bottom portions of the III-V compound semiconductor fins 40 and III-V compound semiconductor pads 42 remain protected by the first dielectric layer 12.

Referring to FIGS. 9A-9B, the second portion of each III-V compound semiconductor fin 40 is completely removed by an etch process. The etch process can be a dry etch or a wet etch that removes the III-V compound semiconductor material of the III-V compound semiconductor fins 40 selective to the dielectric materials of the sidewall spacers 46 and the first dielectric layer 12. In one example, hydrogen peroxide ($H_2O_2$) can be used for removing the III-V compound semiconductor material that provides the III-V compound semiconductor fins 40. The etch process also recess the first portion of each III-V compound semiconductor fin 40 such that a top surface of each remaining first portion of the III-V compound semiconductor fins 40 is located beneath the top surface of the sidewall spacer 46 by a recess depth (rd). After etching, each remaining first portion of the III-V compound semiconductor fins 40 that remains laterally surrounded by the sidewall spacer 46 is herein referred to as an channel III-V compound semiconductor fin portion 40A, while each bottom portion of the III-V compound semiconductor fins 40 that remains laterally surrounded by the first dielectric layer 12 is herein referred as an embedded III-V compound semiconductor fin portion 40B. Each channel III-V compound semiconductor fin portion 40A is an active portion for a subsequently formed FinFET.

The etch process employed herein is a timed etch to remove an exact amount of fin material that is equal to the width of each III-V compound semiconductor fins 40, the channel III-V compound semiconductor fin portions 40A thus formed have substantially same height. By "substantially the same height" it is meant that the height variation in the channel III-V compound semiconductor fin portions 40A is within +/−5 nm.

The removal of the second portion of each III-V compound semiconductor fin 40 provides a first opening 50 that separates each channel III-V compound semiconductor fin portion 40A from a corresponding embedded III-V compound semiconductor fin portion 40B. The recessing of the first portion of each III-V compound semiconductor fin 40 provides a second opening 52 over a top surface of each channel III-V compound semiconductor fin portions 40A.

Besides, depending on the etch process parameters used, a bottom surface of each channel III-V compound semiconductor fin portion 40A and a top surface of each embedded III-V compound semiconductor fin portion 40B formed after the etch process may be planar, circular or triangular.

It should be noted that the etch process employed in the present application is a time-controlled process which can be end at a desired time. At the end of the etch process, the second portion of each III-V compound semiconductor fin 40 is completely removed, however due to the greater width of each III-V compound semiconductor pad 42 as compared to that of each III-V compound semiconductor fin 40, the second portion of each III-V compound semiconductor pad 42 is only partially removed. Thus after etching, each channel III-V compound semiconductor fin portion 40A is still supported at both ends by III-V compound semiconductor pad portions 42P which are remaining portions of the III-V compound semiconductor pads 42.

Referring to FIGS. 10A-10B, an insulator layer 60 is formed over the first dielectric layer 12 and within the first and the second openings 50, 52. The insulator layer 60 is deposited to a thickness such that a top surface of the insulator layer 60 is coplanar with the top surface of the sidewall spacer 46. As is shown, the entirety of each of the first openings 50 and second openings 52 is filled with the insulator layer 60. In the first embodiment of the present application, each pair of channel III-V compound semiconductor fin portion 40A and embedded III-V compound semiconductor fin portion 40B is thus electrically insulated by the insulator portion 60P.

The insulator layer 60 that is formed comprises a different dielectric material than the first dielectric layer 12 and the sidewall spacer 46. In one embodiment, the insulator layer 60 is a flowable oxide such as, for example, silicon dioxide. The insulator layer 60 can be formed utilizing a deposition process such as, for example, CVD or PECVD and subsequently planarized, for example, by chemical mechanical planarization (CMP) using the top surface of the sidewall spacer 46 as an etch stop.

Figure 11B:
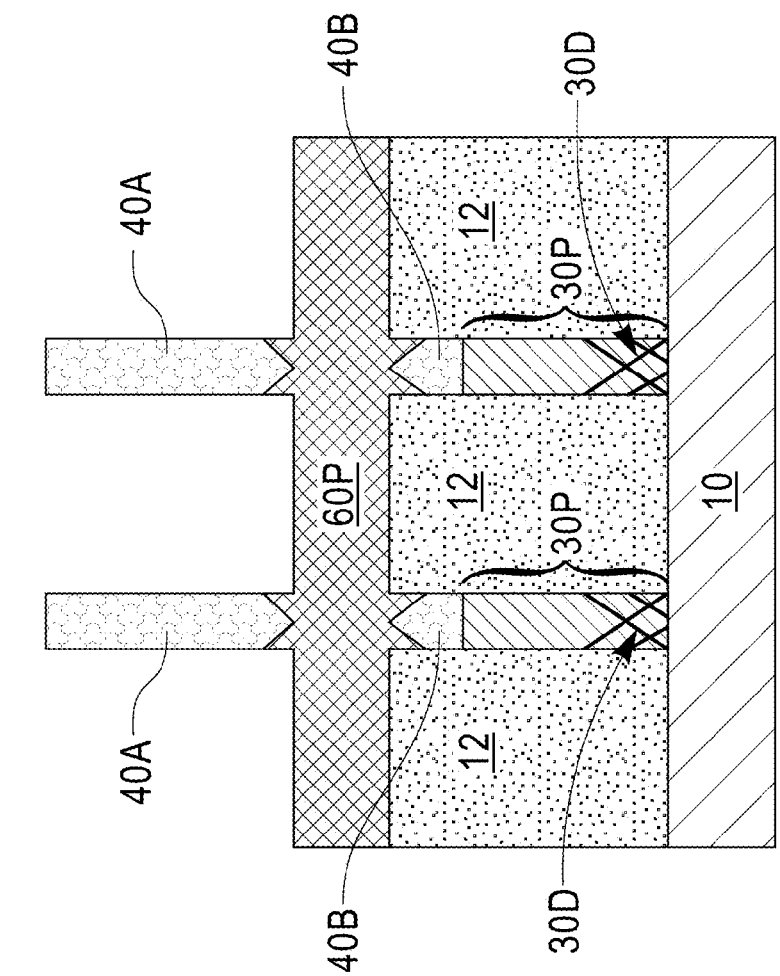
FIG. 11B is a cross sectional view of the first exemplary semiconductor structure of FIG. 11A along vertical plane B-B'.
Figure 11A:
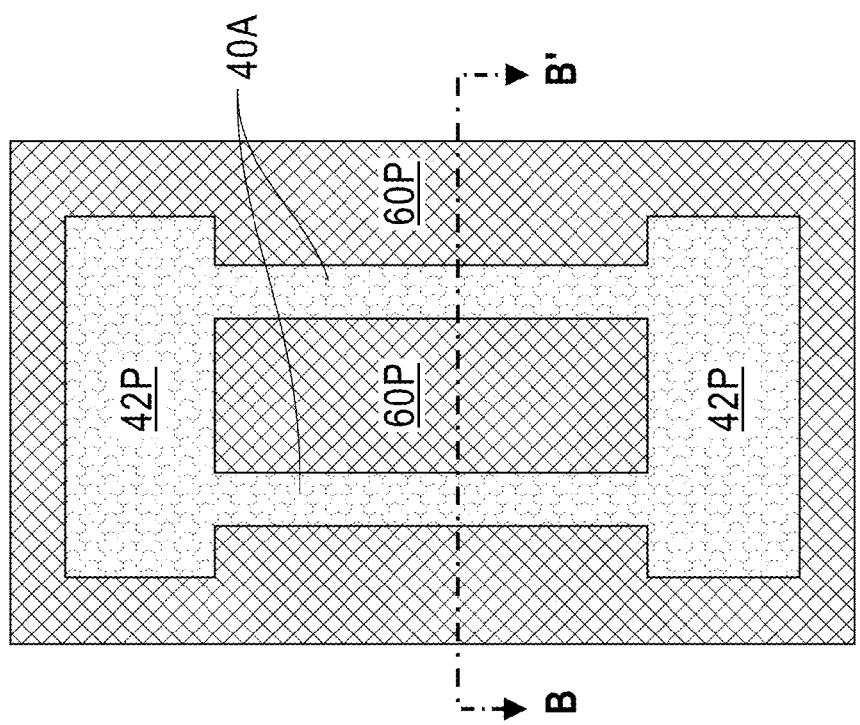
FIG. 11A is a top down view of the first exemplary semiconductor structure of FIGS. 10A-10B after recessing the insulator layer and removing the sidewall spacer to expose sidewalls of each channel III-V compound semiconductor fin portion.

Referring to FIGS. 11A-11B, the insulator layer 60 is recessed to expose the top surface of each channel III-V compound semiconductor fin portion 40A and sidewall surfaces of the sidewall spacer 46 (not shown). The remaining portion of the insulator layer 60 is herein referred to as an insulator portion 60P.

The recessing of the insulator layer 60 may be performed by an etch-back process that removes the dielectric material that provides the insulator layer 60 selective to the dielectric material that provides the sidewall spacer 46 and the III-V compound semiconductor material that provides the channel III-V compound semiconductor fin portions 40A. In one embodiment, the etch-back process can be a dry etch such as, for example, RIE. The top surface of the insulator portion 60P that is formed is vertically offset and located at, or beneath, the bottom surface of the sidewall spacer 46.

Following the recessing of the insulator layer 60, a second removal process such as, for example, another etch, can be used to remove the sidewall spacer 46. The removal of the sidewall spacer 46 exposes sidewall surfaces of each channel III-V compound semiconductor fin portion 40A.

At this point of the present application, a gate structure (not shown) can be formed over a portion of each channel III-V compound semiconductor fin portion 40A to provide a FinFET structure (not shown). The gate structure can be formed utilizing a gate first or a gate last process known in the art. The gate structure may include a gate dielectric portion and a gate conductor portion.

In the present application, the height of each channel III-V compound semiconductor fin portion 40A is determined by the difference between the thickness of the third dielectric layer 16 and the recess depth rd. Since the value of recess depth rd is small, the recess depth variations caused by the non-uniform etch is trivial. As a result, the height uniformity of the channel III-V compound semiconductor fin portions 40A can be greatly improved. In addition, since the embedded III-V compound semiconductor fin portions 40B that are buried underneath the insulator portion 60P do not constitute active portions in the final FinFET structure, the height variations of the embedded III-V compound semiconductor fin portions 40B have no impact on the device performance.

Figure 12C:
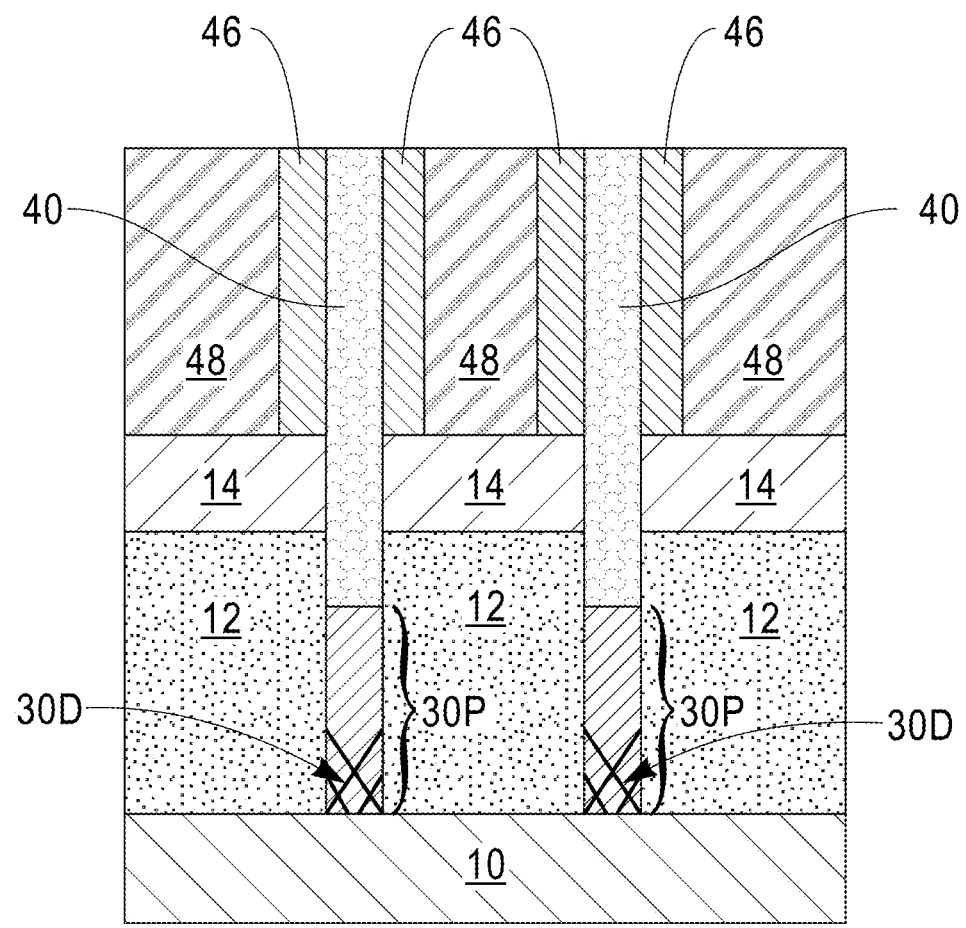
FIG. 12C is a cross sectional view of the variation of the first exemplary semiconductor structure of FIG. 12A along vertical plane C-C'.

Referring to FIGS. 12A-12C, a variation of the first exemplary semiconductor structure of the present application can be derived from FIGS. 7A-7B by forming anchoring structures 48 at opposite end portions of III-V compound semiconductor fins 40 in instances where no end trenches 20 are present in the exemplary structure, thus no stacks of the insulating III-V compound material pad portions 32P and the III-V compound semiconductor pads 42 are present to support the subsequently formed channel III-V compound semiconductor fin portions 40A. The anchoring structures 48 hold the channel III-V compound semiconductor fin portions 40A after they are suspended.

The anchoring structures 48 may include any sacrificial material that has a different etch rate than that of the second dielectric layer 14 and the III-V compound semiconductor material that provides the III-V compound semiconductor fins 40. In one embodiment, the anchoring structures 48 may include doped or undoped polysilicon. In another embodiment, the anchoring structures 48 may include a dielectric material the same as the dielectric material providing the sidewall spacer 46.

The anchoring structures 48 can be formed by first depositing a sacrificial material. When doped, the dopant can be introduced into the sacrificial material during the deposition process or after utilizing one of ion implantation or gas phase doping. Following the deposition process and optional dopant introduction, the sacrificial material may be patterned utilizing lithography and etching as mentioned above to provide the anchoring structures 48.

The processing steps of FIGS. 8A-8B, 9A-9B and 10A-10B are performed sequentially to form channel III-V compound semiconductor fin portions 40A and embedded III-V compound semiconductor fin portions 40B and an insulator layer 60. After recessing the insulator layer 60 by performing the processing steps of FIGS. 11A-11B, the anchoring structures 48 can be removed by an etch process. The sidewall spacer 46 can be subsequently removed by performing the processing steps of FIGS. 11A-11B.

Figures 13A, 13B:
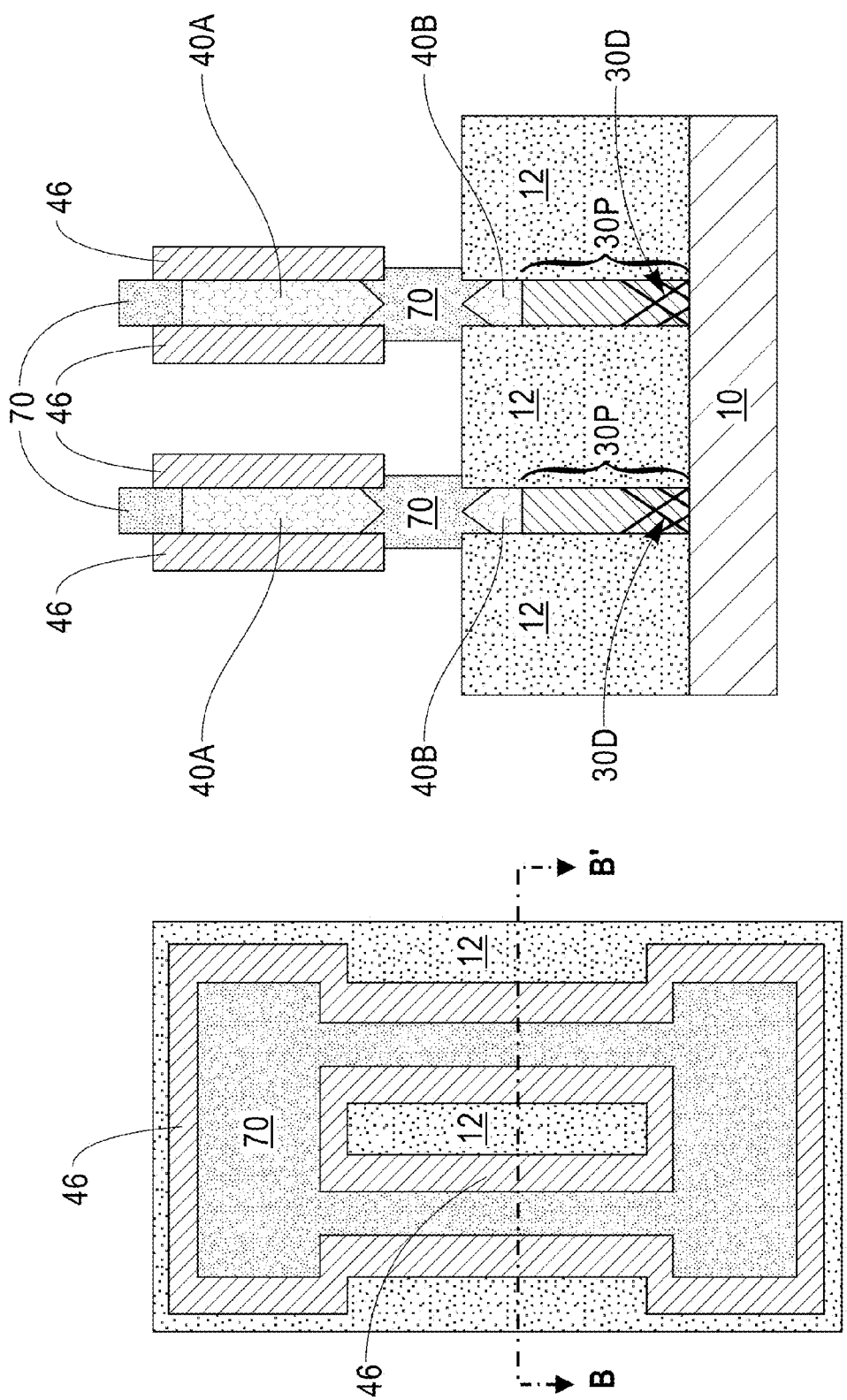
FIG. 13A is a top down view of a second exemplary semiconductor structure that can be derived from FIGS. 9A-9B after epitaxially growing an insulating III-V compound material layer from exposed surfaces of each channel III-V compound semiconductor fin portion and each embedded III-V compound semiconductor fin portion according to a second embodiment of the present application.
FIG. 13B is a cross sectional view of the second exemplary semiconductor structure of FIG. 13A along vertical plane B-B'.

Referring to FIGS. 13A-13B, a second exemplary semiconductor structure according to a second embodiment of the present application can be derived from FIGS. 9A-9B by epitaxially growing an insulating III-V compound material layer 70 from exposed surfaces of channel III-V compound semiconductor fin portions 40A, embedded III-V compound semiconductor fin portions 40B and III-V compound semiconductor pad portions 42P, if present.

The insulating III-V compound material layer 70 may comprise one of the insulating III-V compound materials as mentioned above for insulating III-V compound material fins 30. In one embodiment, the insulating III-V compound material layer 70 comprises a same insulating III-V compound material as the insulating III-V compound material fins 30. In another embodiment, the insulating III-V compound material layer 70 comprises a different insulating III-V compound material than the insulating III-V compound material fins 30. In one embodiment, the III-V compound insulator layer is composed of InP.

The insulating III-V compound material layer 70 can be formed by one of the epitaxial growth processes mentioned above in forming insulating III-V compound material fins 30. The epitaxial growth process is continued until each pair of channel III-V compound semiconductor fin portions 40A and embedded III-V compound semiconductor fin portions 40B are merged by the insulating III-V compound material layer 70. In one embodiment and as shown in FIG. 13B, sidewalls of the insulating III-V compound material layer 70 may extend beyond the sidewalls of the embedded channel III-V compound semiconductor fin portions 40A and embedded III-V compound semiconductor fin portions 40B.

Figure 14B:
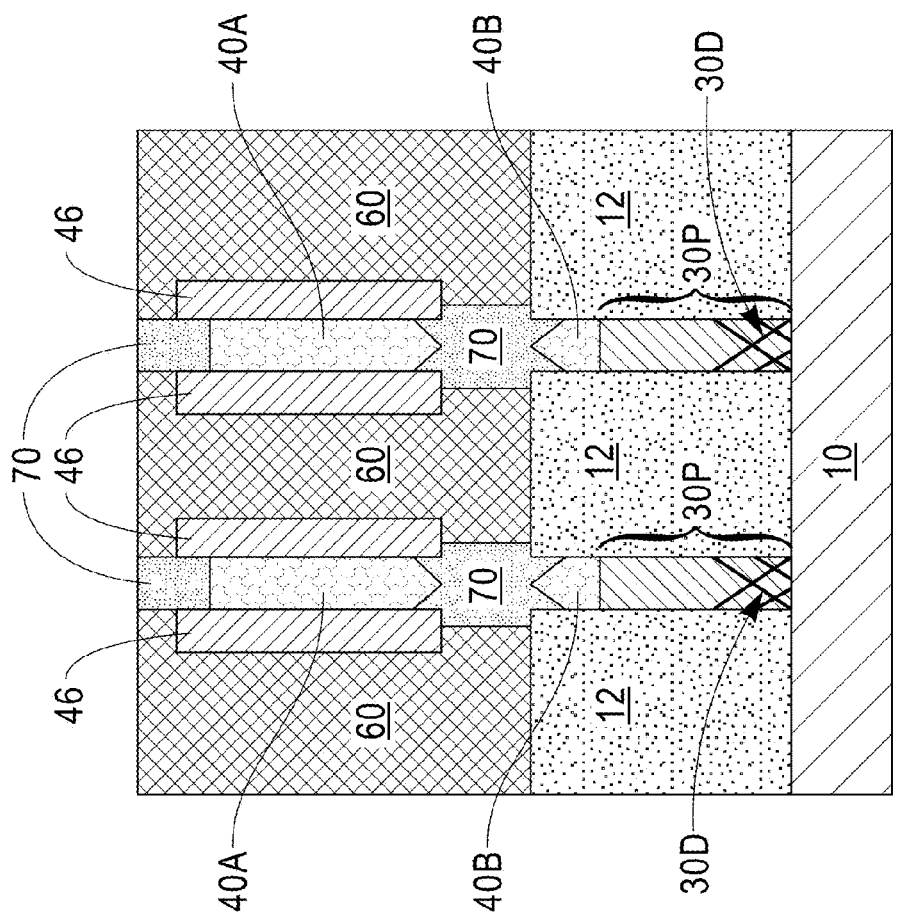
FIG. 14B is a cross sectional view of the second exemplary semiconductor structure of FIG. 14A along vertical plane B-B'.
Figure 14A:
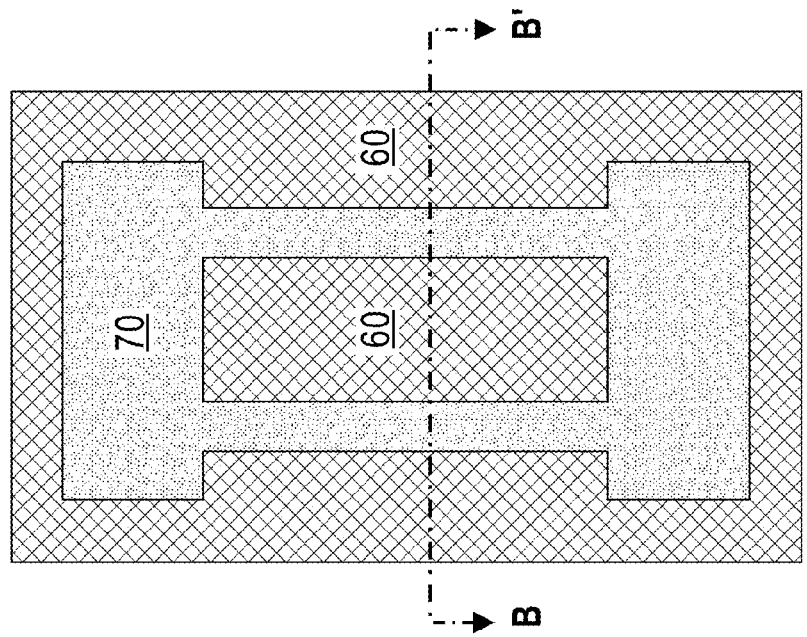
FIG. 14A is a top down view of the second exemplary semiconductor structure of FIGS. 13A-13B after forming an insulator layer over the first dielectric layer to laterally surround the insulating III-V compound material layer and the sidewall spacer.

Referring to FIGS. 14A-14B, an insulator layer 60 is formed over the first dielectric layer 12, the sidewall spacer 46 and the insulating III-V compound material layer 70 by performing processing steps of FIGS. 10A-10B. The insulator layer 60 has a top surface that is coplanar with a top surface of the III-V compound insulator layer 70.

Figures 15A, 15B:
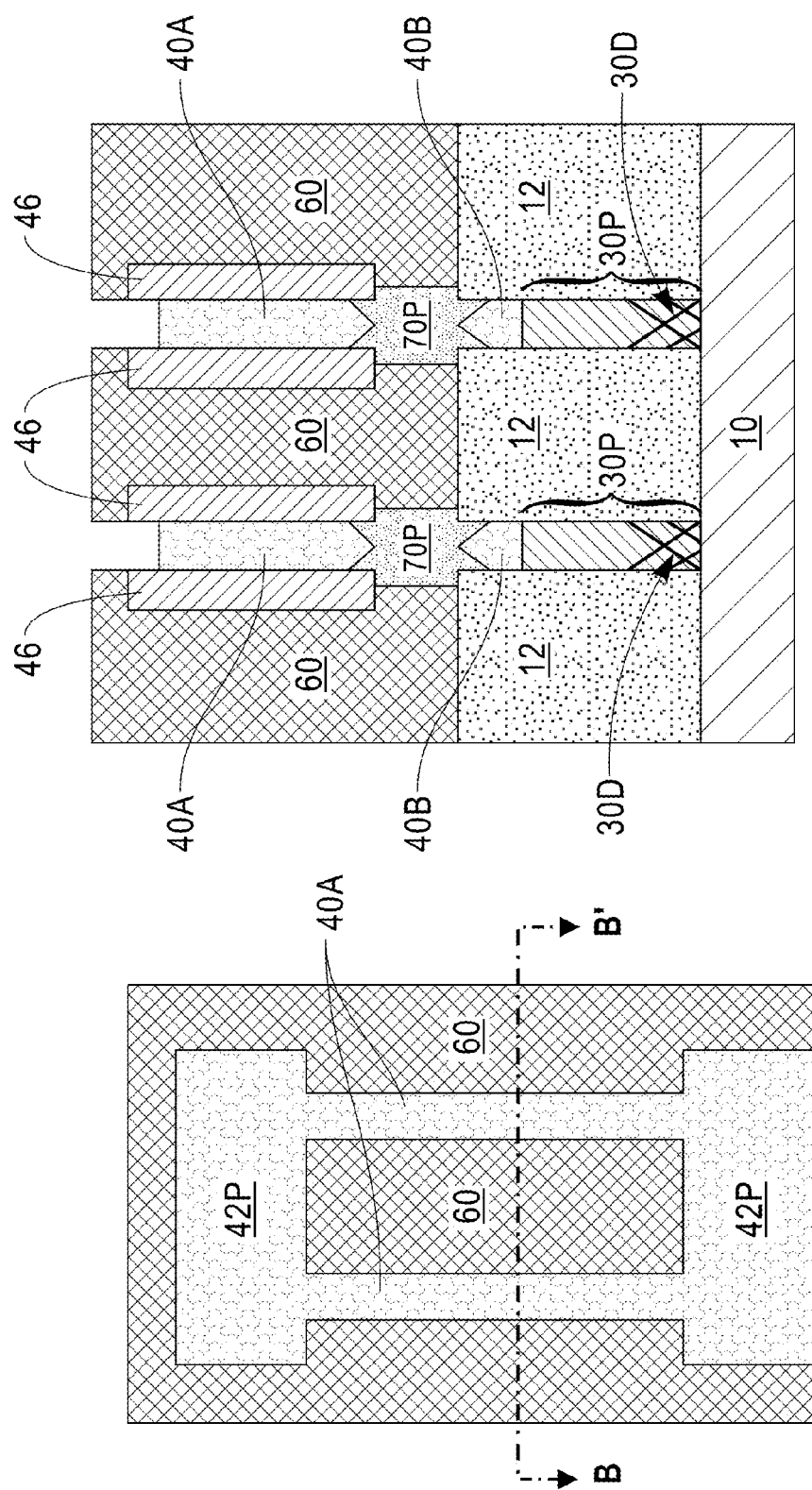
FIG. 15A is a top down view of the second exemplary semiconductor structure of FIGS. 14A-14B after removing portions of the insulator layer that are located over a top surface of each channel III-V compound semiconductor fin portion.
FIG. 15B is a cross sectional view of the second exemplary semiconductor structure of FIG. 15A along vertical plane B-B'.

Referring to FIGS. 15A-15B, portions of the insulating III-V compound material layer 70 that are located above the top surfaces of channel III-V compound semiconductor fin portions 40A and III-V compound semiconductor pad portions 42P are removed to expose the top surfaces of channel III-V compound semiconductor fin portions 40A and III-V compound semiconductor pad portions 42P. An etch process such as a dry etch process or a wet etch process can be employed to remove the insulting III-V compound material providing the insulating III-V compound material layer 70 selective to dielectric materials of the sidewall spacers 46 and the insulator layer 60. Portions of the insulating III-V compound material layer 70 that are located between the channel III-V compound semiconductor fin portions 40A and the embedded III-V compound semiconductor fin portions 40B remain intact. Each remaining portion of the insulating III-V compound material layer 70 connecting each pair of the channel III-V compound semiconductor fin portions 40A and embedded III-V compound semiconductor fin portions 40B is herein referred to as an insulating III-V compound material portion 70P.

In the second embodiment of the present application, each pair of channel III-V compound semiconductor fin portion 40A and embedded III-V compound semiconductor fin portion 40B is thus electrically insulated by an insulating III-V compound material portion 70P.

Figure 16B:
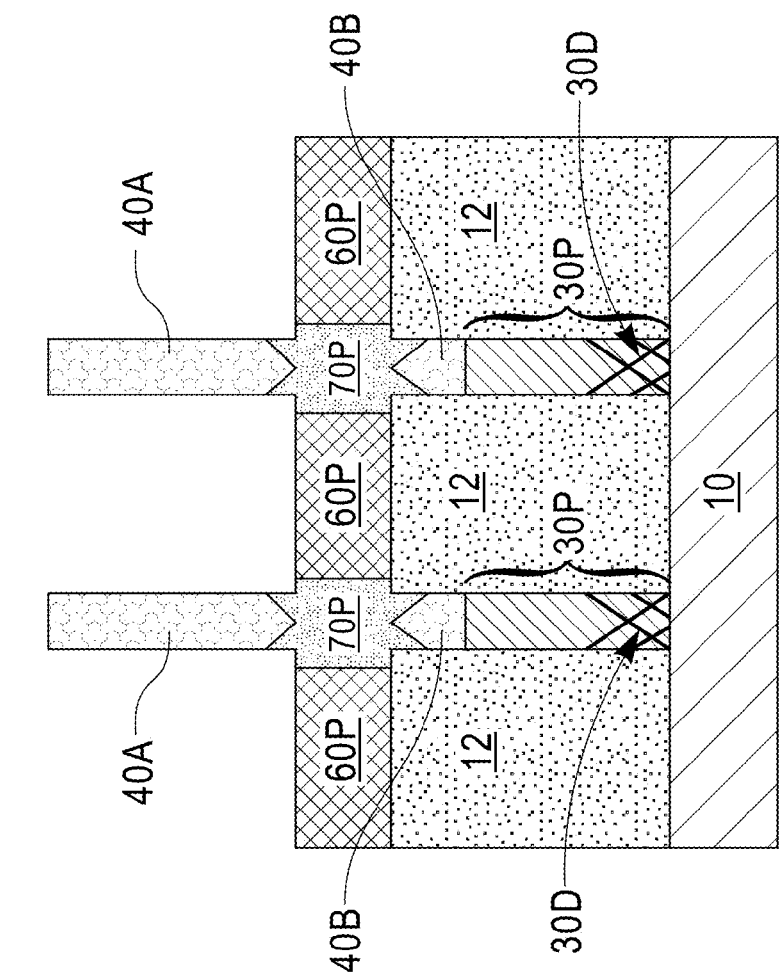
FIG. 16B is a cross sectional view of the second exemplary semiconductor structure of FIG. 16A along vertical plane B-B'.
Figure 16A:
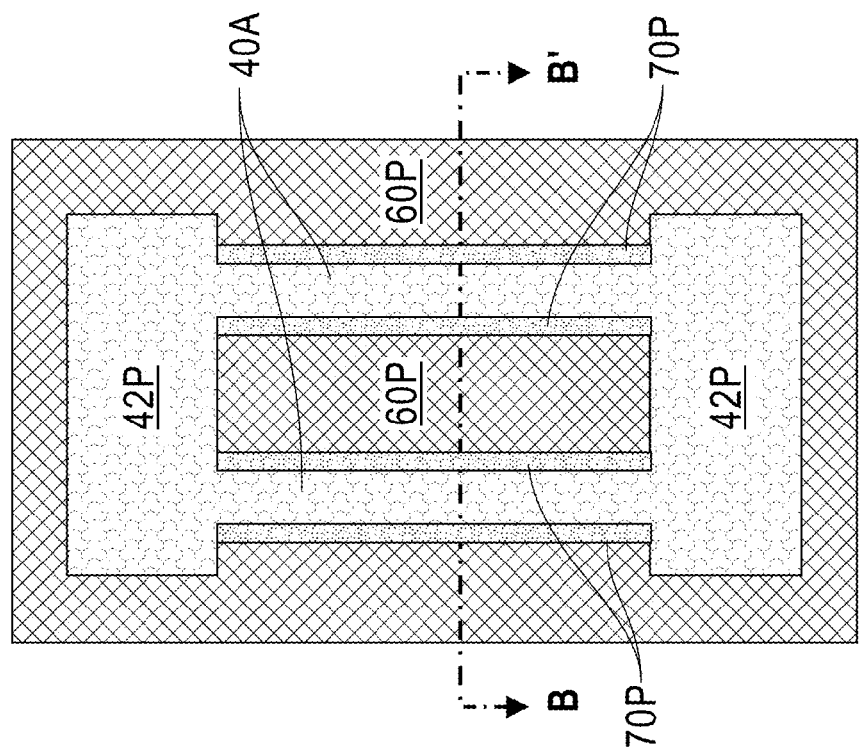
FIG. 16A is a top down view of the second exemplary semiconductor structure of FIGS. 14A-14B after removing remaining portions of the insulator layer and the sidewall spacer.

Referring to FIGS. 16A-16B, the insulator layer 60 is recessed followed by removing the sidewall spacer 46 by performing the processing steps of FIGS. 11A-11B. Sidewall surfaces of each channel III-V compound semiconductor fin portion 40A are thus exposed.

At this point of the present application, a gate structure can be formed over a portion of each channel III-V compound semiconductor fin portion 40A to provide a FinFET structure (not shown). The gate structure can be formed utilizing a gate first or a gate last process known in the art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a fin stack of, from bottom to top, an insulating III-V compound material fin portion and an embedded III-V compound semiconductor fin portion located over a semiconductor substrate and laterally surrounded by a dielectric layer;
an insulator portion located over the dielectric layer and the embedded III-V compound semiconductor fin portion; and
a channel III-V compound semiconductor fin portion located over the insulator portion.

2. The semiconductor structure of claim 1, wherein the channel III-V compound semiconductor fin portion comprises a same III-V compound semiconductor material as the embedded III-V compound semiconductor fin portion.

3. The semiconductor structure of claim 2, wherein each of the embedded III-V compound semiconductor fin portion and the channel III-V compound semiconductor fin portion comprises InAs, InGaAs, InGaSb or GaAs.

4. The semiconductor structure of claim 1, wherein the insulating III-V compound material fin portion comprises InP or InAlAs.

5. The semiconductor structure of claim 1, wherein sidewalls of the channel III-V compound semiconductor fin portion are vertically coincident with sidewalls of the insulating III-V compound material fin portion and sidewalls of the embedded III-V compound semiconductor fin portion.

6. The semiconductor structure of claim 1, wherein the insulator portion comprises a flowable oxide.

7. The semiconductor structure of claim 1, further comprising:
another fin stack of, from bottom to top, another insulating III-V compound material fin portion and another embedded III-V compound semiconductor fin portion located over another portion of semiconductor substrate and laterally surrounded by the dielectric layer; and
another channel III-V compound semiconductor fin portion overlying the another embedded III-V compound semiconductor fin portion, wherein the another channel III-V compound semiconductor fin portion is electrically insulated from the another embedded III-V compound semiconductor fin portion by the insulator portion.

8. The semiconductor structure of claim 7, wherein the embedded III-V compound semiconductor fin portion and the another embedded III-V compound semiconductor fin portion have different heights, and the channel III-V compound semiconductor fin portion and the another channel III-V compound semiconductor fin portion have a substantially same height.

9. A semiconductor structure comprising:
a fin stack of, from bottom to top, an insulating III-V compound material fin portion and an embedded III-V compound semiconductor fin portion located over a semiconductor substrate and laterally surrounded by a dielectric layer;
an insulating III-V compound material portion located over the embedded III-V compound semiconductor fin portion and laterally surrounded by an insulator portion; and
a channel III-V compound semiconductor fin portion located over the insulating III-V compound material portion.

10. The semiconductor structure of claim 9, wherein sidewalls of the channel III-V compound semiconductor fin portion are vertically coincident with sidewalls of the insulating III-V compound material fin portion and sidewalls of the embedded III-V compound semiconductor fin portion.

11. A method of forming a semiconductor structure comprising:
forming a trench extending through a dielectric material stack of, from bottom to top, a first dielectric layer, a second dielectric layer and a third dielectric layer located over a semiconductor substrate;
forming a fin stack of, form bottom to top, an insulating III-V compound material fin portion and a III-V compound semiconductor fin within the trench, wherein a top surface of the insulating III-V compound material fin portion is located below a top surface of the first dielectric layer;
removing the third dielectric layer to expose sidewalls of a first portion of the III-V compound semiconductor fin located above the second dielectric layer;
forming a sidewall spacer over the exposed sidewalls of the first portion of the III-V compound semiconductor fin;
removing the second dielectric layer to expose a second portion of the III-V compound semiconductor fin; and
removing the exposed second portion of the III-V compound semiconductor fin to provide an opening that separates the first portion of the III-V compound semiconductor fin from a bottom portion of the III-V compound semiconductor fin that is embedded in the first dielectric layer.

12. The method of claim 11, further comprising forming an insulator layer over the first dielectric layer.

13. The method of claim 12, wherein the insulator layer completely fills the opening formed between the first portion and the bottom portion of the III-V compound semiconductor fin.

14. The method of claim 12, further comprising recessing the insulator layer to expose the sidewall spacer.

15. The method of claim 14, further comprising removing the sidewall spacer.

16. The method of claim 12, wherein an etch process that the removes the exposed second portion of the III-V compound semiconductor fin also removes an upper portion of the first portion of the III-V compound semiconductor fin to provide another opening, wherein the insulator layer is formed within the another opening.

17. The method of claim 11, further comprising forming a pad stack of, from bottom to top, an insulating III-V compound material pad portion and a III-V compound semiconductor pad on opposite ends of the fin stack.

18. The method of claim 11, further comprising forming anchoring structures at opposite end portions of the fin stack prior to the removing the second dielectric layer.

19. The method of claim 18, further comprising removing the anchoring structures after the removing the sidewall spacer.

20. The method of claim 11, further comprising forming an insulating III-V compound material portion to completely fill the opening located between the first portion and the bottom portion of the III-V compound semiconductor fin prior to the forming the insulator layer.

* * * * *